US009335937B2

United States Patent
Seo et al.

(10) Patent No.: US 9,335,937 B2
(45) Date of Patent: May 10, 2016

(54) METHOD OF OPERATING A FLASH MEMORY SYSTEM USING A MIGRATION OPERATION

(71) Applicant: SAMSUNG ELECTRONICS CO., LTD., Suwon-si, Gyeonggi-do (KR)

(72) Inventors: Dong-Young Seo, Suwon-si (KR); Young Bong Kim, Seoul (KR); Dongeun Shin, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/718,886

(22) Filed: May 21, 2015

(65) Prior Publication Data

US 2015/0254015 A1    Sep. 10, 2015

Related U.S. Application Data

(63) Continuation of application No. 14/315,669, filed on Jun. 26, 2014.

(30) Foreign Application Priority Data

Mar. 3, 2014   (KR) .......................... 10-2014-0025091

(51) Int. Cl.
*G06F 3/06* (2006.01)
*G06F 12/06* (2006.01)
(Continued)

(52) U.S. Cl.
CPC .............. *G06F 3/0611* (2013.01); *G06F 3/064* (2013.01); *G06F 3/0619* (2013.01); *G06F 3/0635* (2013.01); *G06F 3/0647* (2013.01); *G06F 3/0658* (2013.01); *G06F 12/06* (2013.01); *G11C 11/5671* (2013.01); *G11C 16/00* (2013.01); *G06F 3/0679* (2013.01); *G06F 2206/1014* (2013.01); *G06F 2212/1032* (2013.01); *G06F 2212/2022* (2013.01)

(58) Field of Classification Search
CPC ... G06F 3/0611; G06F 3/0679; G06F 3/0647; G06F 2206/1014
USPC ......................................................... 711/103
See application file for complete search history.

(56) References Cited

U.S. PATENT DOCUMENTS 7,953,931 B2   5/2011   Yu et al.
8,085,569 B2   12/2011   Kim
8,234,466 B2   7/2012   Yeh
(Continued)

OTHER PUBLICATIONS

A 45nm 6b/cell Charge-Trapping Flash Memory Using LDPC-Based ECC and Drift-Immune Soft-Sensing Engine by Kin-Chu Ho; IEEE 2013.*

(Continued)

*Primary Examiner* — Reginald Bragdon
*Assistant Examiner* — Paul Knight
(74) *Attorney, Agent, or Firm* — Volentine & Whitt, PLLC

(57) ABSTRACT

A method of operating a memory system includes; storing data in a buffer region of the nonvolatile memory, later issuing a migration request directed to the data stored in the buffer region and executing a migration operation to move the data from buffer region to a main region of the nonvolatile memory device. Upon completion of the migration operation, marking a migration operation completion time, and after an initial verify shift (IVS) time has elapsed following the migration operation completion time, updating a mapping table associated with the data in view of the executed migration operation.

18 Claims, 19 Drawing Sheets

(51) Int. Cl.
*G11C 11/56* (2006.01)
*G11C 16/00* (2006.01)

(56) References Cited

U.S. PATENT DOCUMENTS

| | | | |
|---|---|---|---|
| 8,296,510 | B2 | 10/2012 | Radke et al. |
| 8,315,093 | B2 | 11/2012 | Dong et al. |
| 2009/0055577 | A1* | 2/2009 | Moon et al. .................... 711/103 |
| 2010/0217927 | A1* | 8/2010 | Song et al. .................... 711/103 |
| 2011/0029751 | A1* | 2/2011 | Nobunaga .................... 711/165 |
| 2012/0023283 | A1 | 1/2012 | Yang |
| 2012/0047318 | A1* | 2/2012 | Yoon et al. .................... 711/103 |
| 2012/0265928 | A1* | 10/2012 | Mun et al. .................... 711/103 |
| 2012/0284574 | A1 | 11/2012 | Avila et al. |
| 2012/0290897 | A1 | 11/2012 | Yoon et al. |
| 2013/0046920 | A1 | 2/2013 | Ryu et al. |
| 2013/0114354 | A1 | 5/2013 | Ryu |
| 2014/0059270 | A1* | 2/2014 | Zaltsman et al. ............. 711/103 |
| 2014/0082261 | A1* | 3/2014 | Cohen et al. .................. 711/103 |
| 2014/0325117 | A1* | 10/2014 | Canepa et al. ................ 711/103 |
| 2015/0178189 | A1* | 6/2015 | Lasser .......................... 711/103 |
| 2015/0193299 | A1* | 7/2015 | Hyun et al. ................... 711/103 |

OTHER PUBLICATIONS

A Block-Level Flash Memory Management Scheme for Reducing Write Activities in PCM-based Embedded Systems by Liu; EDAA 2012.*

* cited by examiner

FIG. 8

| LA | PA | Log |
|----|----|-----|
| 1  | 0  | ML1a, ML1b,...etc |
| 2  | 1  | ML2a, ML2b,...etc |
| ⋮  |    |     |
| N  | M  | MLna, MLnb,...etc |

1241a

METHOD OF OPERATING A FLASH MEMORY SYSTEM USING A MIGRATION OPERATION

CROSS-REFERENCE TO RELATED APPLICATION

This is a Continuation of co-pending U.S. application Ser. No. 14/315,669, filed Jun. 26, 2014, which makes a claim of priority under 35 USC §119 to Korean Patent Application No. 10-2014-0025091 filed on Mar. 3, 2014, the subject matter of which is hereby incorporated by reference herein.

BACKGROUND

The inventive concept relates generally to memory systems, memory devices, and methods of operating a memory system. More particularly the inventive concept relates to methods of operating a memory system including a nonvolatile memory device, wherein a migration operation is used to move data from a buffer region to a main region of the nonvolatile memory device.

Memory systems including one or more nonvolatile semiconductor memory devices have become staple components in contemporary consumer electronic products. A variety of nonvolatile semiconductor memory devices are known, including as examples, the electrically erasable programmable read only memory (EEPROM), the phase-change random access memory (PRAM), the magnetic random access memory (MRAM), and the resistance read only memory (ReRAM). Within the broad class of nonvolatile semiconductor memory devices, flash memory provides certain advantages such as rapid reading speed, low power consumption, very dense data storage capacity, etc. As a result, many contemporary memory systems incorporated in contemporary digital computational platforms and consumer electronics include flash memory as a data storage medium.

In general, a flash memory device stores data information by applying electrical charge to a conductive floating gate structure surrounded and isolated by an insulator film. However, a number of physical limitations and operating challenges exist in relation to the floating gate structure. For example, attempts to reduce the physical size of the floating gate structure in order to improve integration density of the constituent memory cells causes problems with undesired capacitive coupling of electrical charge between proximate memory cells and/or memory cell transistors.

Attempts to mitigate the capacitive coupling effects between proximate flash memory cells lead to the development of the so-called charge trap flash or CTF memory cell, wherein a CTF memory cell typically incorporates an isolator film fabricated from a material such as $Si_3N_4$, $Al_2O_3$, HfAlO, etc. as an electrical charge storing element replacing the conductive floating gate structure previously used. In certain three-dimensional (3D) memory cell array configurations, CTF memory cells have been used with good effect. Such configurations tend to greatly increase the per unit area, data-storage integration density of the constituent nonvolatile flash memory device. However, CTF memory cells are not without their own challenges. In particular, CTF memory cells often suffer from a phenomenon referred to as "initial verify shift" or "IVS". This phenomenon is characterized by an undesired rearrangement of recombination of charge carriers (holes and/or electrons) on the charge storing layer of the CTF memory cells following execution of a program operation or an erase operation. Such charge carrier rearrangement tends to shift the threshold voltages of the CTF memory cells in a manner that may lead to data loss. Most troubling, the IVS phenomenon happens over a period of time following the programming (or erasing) of memory cells, and as such, memory cells already verified as having been properly programmed (or erased) may experience a threshold voltage shift that essentially changes the programmed (or erased) state of the memory cell.

SUMMARY

Embodiments of the inventive concept prevent the adverse effects of the IVS phenomenon on flash memory cells by effectively managing the update of a mapping table associated with the flash memory following execution of a migration operation.

In one embodiment, the inventive concept provides a method of operating a memory system including a memory controller and a nonvolatile memory device, the method comprising; storing data in a buffer region of the nonvolatile memory device under the control of the memory controller, by operation of the memory controller, issuing a migration request directed to the data stored in the buffer region, executing a migration operation in the nonvolatile memory device in response to the migration request, where the migration operation moves the data from buffer region to a main region of the nonvolatile memory device, and upon completion of the migration operation, marking a migration operation completion time, and after an initial verify shift (IVS) time has elapsed following the migration operation completion time, updating a mapping table associated with the data in view of the executed migration operation.

In another embodiment, the inventive concept provides a method of operating a memory system including a memory controller and a flash memory device including a buffer region and a main region separately designated from the buffer region, the method comprising; in response to a write request received from a host and identifying write data according to a logical address, storing the write data in the buffer region according to a first physical address, by operation of the memory controller, issuing a migration request directed to the write data stored in the buffer region, determining whether a sufficient number of spare regions exist the main region to store the write data, upon determining that a sufficient number of spare regions do exist in the main region, executing a migration operation in the nonvolatile memory device in response to the migration request, where the migration operation moves the write data from a first location in the buffer region identified by the first physical address to a second location in the main region identified by a second physical address, and upon completion of the migration operation, marking a migration operation completion time, and after an initial verify shift (IVS) time has elapsed following the migration operation completion time, updating a mapping table associated with the write data to change the first physical address to the second physical address.

In another embodiment, the inventive concept provides a method of operating a memory system including a memory controller and a flash memory device including a buffer region and a main region separately designated from the buffer region, the method comprising; in response to respective 1st through Nth write requests received from a host, each write request identifying a corresponding 1st through Nth write data according to a 1st through Nth logical address, storing the 1st through Nth write data in the buffer region using respective single bit program operations, upon determining that insufficient spare regions exist in the buffer region, issuing a migration request directed to the 1st through Mth write data stored in the buffer region, where 'M' is a natural number less than or equal 'N', also a natural number, determining whether a sufficient number of spare regions exist the main region to store the 1st through Mth write data, upon determining that a sufficient number of spare regions do exist in the main region, executing a migration operation in the nonvolatile memory device in response to the migration request, where the migration operation moves the 1st through Mth write data from respective 1st through Mth locations in the buffer region identified by the 1st through Mth physical addresses to corresponding Kth through (Kth+Mth) locations in the main region identified by Kth through (Kth+Mth) physical addresses, and upon completion of the migration operation, marking a migration operation completion time, and after an initial verify shift (IVS) time has elapsed following the migration operation completion time, updating a mapping table associated with the 1st through Nth write data to respectively change the 1st through Mth physical addresses to the Kth through (Kth+Mth) physical addresses.

BRIEF DESCRIPTION OF THE DRAWINGS

The above and other features and advantages of the inventive concept will become more apparent upon consideration of certain embodiments of the illustrated in the accompanying drawings.

FIG. 8 is a table listing one exemplary composition of a mapping table that may be used in conjunction with the method of operating the memory system of FIG. 7.

DETAILED DESCRIPTION

Figure 1:
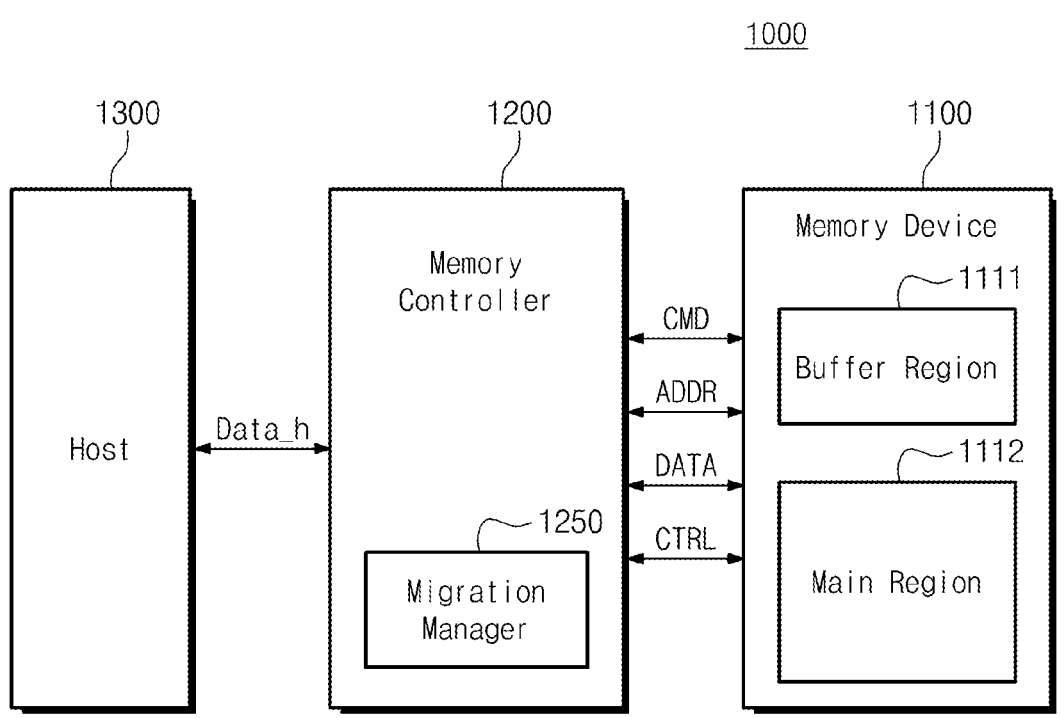
FIG. 1 is a block diagram illustrating a memory system according to an embodiment of the inventive concept.

Certain embodiments of the inventive concept will now be described with reference to the accompanying drawings. However, the inventive concept may be variously embodied and should not be construed as being limited to only the illustrated embodiments. Throughout the written description and drawings, like reference numbers denote like or similar elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion e.g., "between" versus "directly between", "adjacent" versus "directly adjacent", etc.

The terminology used herein is for the purpose of describing particular embodiments only and is not intended to be limiting of example embodiments of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in relation to certain illustrated embodiments, certain functions, acts, and/or steps may be performed in an order other than the specific order described in relation to illustrated embodiments. Further, two or more functions, acts and/or steps shown as occurring in succession may, in fact, be executed substantially concurrently or may sometimes be executed in a reverse order depending on the functionality, acts and/or steps involved.

Unless otherwise defined, all terms, including technical and scientific terms, used herein have the same meaning as commonly understood by one of ordinary skill in the art to which example embodiments of the inventive concept belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure (FIG. 1 is a block diagram illustrating a memory system according to an embodiment of inventive concept.

Referring to FIG. 1, a memory system 1000 comprises a memory device 1100, a memory controller 1200 and host 1300.

Here, the memory device 1100 according to the certain embodiments of the inventive concept may include a memory cell array having a 2-dimensional structure, and/or a separate memory cell array having a 3-dimensional structure (e.g., a 3D flash memory).

However, configured, the memory device 1100 will be operationally controlled by the memory controller 1200 to perform a sequence of variously defined "operations" in response to one or more requests, commands, and/or instructions received from the host 1300. Operations will vary in definition between different memory systems, but will typically include at least read, write (or program), and/or erase operations, as well as certain housekeeping operations necessary to the efficient overall performance of the memory system 1000.

In various embodiments of the inventive concept, the memory device 1100 will include a buffer region 1111 specifically designated from a main region 1112. The buffer region 1111 may be implemented as one or more separately provisioned semiconductor memory chips, and/or as a designated portion (or combination of portions) of a larger memory cell array also used to implement the main region 1112.

In certain embodiments, the buffer region 1111 may be implemented using an arrangement of single-level memory cells (SLC), each SLC being configured to store a single bit of data per memory cell. In contrast, the main region 1112 may be implemented using an arrangement of multi-level memory cells (MLC), each MLC being configured to store 2 or more bits of data per memory cell.

Alternately, both of the buffer region 1111 and main region 1112 may be implemented using MLC, wherein only a Least Significant Bit (LSB) of each MLC is used to store single-bit data in the buffer region 1111 in response to a single bit program operation.

Alternately, both of the buffer region 1111 and main region 1112 may be implemented using SLC.

In general operation of the memory device 1100, incoming "write data" (i.e., data to be written or programmed to the memory device 1100) received from the host 1300 during a write operation will first be stored in the buffer region 1111.

The memory controller 1200 is functionally connected between the memory device 1100 and host 1300. As such, the memory controller 1200 may be used to receive host-defined data (e.g., write data or incoming data, generally designated "Data_h"), and to receive memory device-defined data (e.g., read data retrieved from the memory device 1100 during a read or similar operation, generally designated "DATA"). In addition to controlling exchanges of various data between the host 1300 and memory device 1100, the memory controller 1200 may also be used to generate and communicate various command information (CMA) and address information (ADDR) related to the exchange of various data, as well as one or more control signal(s) (CTRL) to the memory device 1100.

In the illustrated embodiment of FIG. 1, the memory controller 1200 comprises a migration manager 1250. The migration manager 1250 may be variously implemented using hardware, firmware and/or software components provided by the memory controller 1200. However configured, the migration manager 1250 may be used to define and control the execution of a "migration operation" by the memory device 1100. Migration operations may be defined differently in different memory systems, but however defined, a migration operation will be capable of moving (or transferring) data stored in the buffer region 1111 to the main region 1112 of the memory device 1100.

Further, in response to the execution of a migration operation by the memory device 1100, the migration manager 1250 will update (or manage) one or more a mapping tables (hereafter, singularly or collectively referred to as "the mapping table") used to convert logical address (LA) information (e.g.,) received from the host 1300 in relation to certain write data into corresponding physical address (PA) information used to store the write data in the main region 1112 of the memory device 1100. The term "mapping table" is used in this context to denote a variety of data structures, data filing systems, and/or data tracking approaches that may be used to conveniently capture (and update) information sufficient to accurately correlate logical address(es) with corresponding physical address(es).

Still further, in response to the execution of a migration operation by the memory device 1100, the migration manager 1250 will monitor and control a mapping table "update time" during which the mapping table is updated following execution of a migration operation.

By inclusion of a competent migration manager 1250 within the memory controller 1200, the memory system 100 may markedly reduce the probability of read errors caused by the IVS phenomenon noted above. This outcome will be better understood upon consideration of the following.

Figure 2:
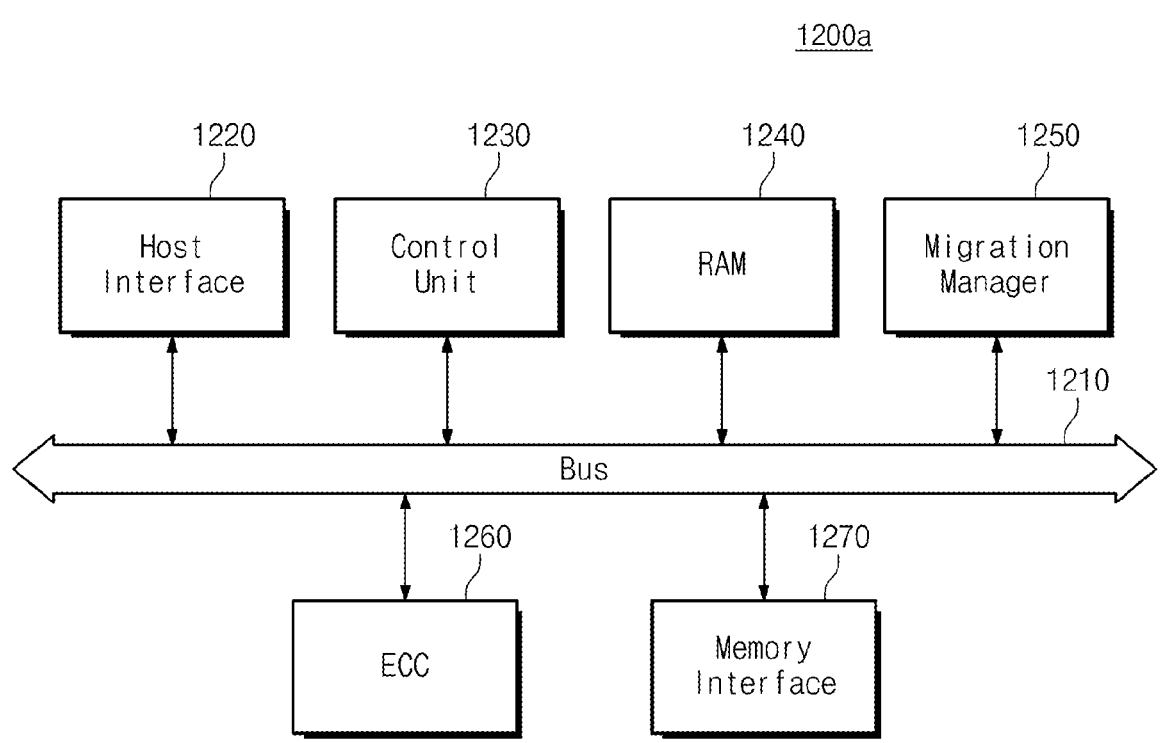
FIG. 2 is a block diagram further illustrating in one example the memory controller of FIG. 1.

FIG. 2 is a block diagram further illustrating in one example (1200a) the memory controller 1200 of FIG. 1. Referring to FIG. 2, the memory controller 1200a comprises in relevant part: a system bus 1210, a host interface 1220, control unit 1230, a Random Access Memory (RAM) 1240, the migration manager 1250, an Error Correcting Code (ECC) unit 126, and a memory interface 1270.

The system bus 1210 generally provides a connection channel between the various elements of the memory controller 1200a noted above.

The host interface 1220 may be used to enable communicate with the host 1300 using one or more conventionally understood communication standard(s). For example, the host interface 1220 may enable one or more communication standards, such as Universal Serial Bus (USB), Peripheral Component Interconnection (PCI), PCI-express (PCI-E), Advanced Technology Attachment (ATA), Serial-ATA, Parallel-ATA, Small Computer Small Interface (SCSI), Enhanced Small Disk Interface (ESDI), Integrated Drive Electronics (IDE), fire-wire, etc.

The control unit 1230 may be used to receive host-defined data (Data_h) as well as related command and address information from the host 1300, and to control the overall operation of the memory controller 1200.

The RAM 1240 may be used as a cache or buffer memory to temporarily store data (e.g., Data_h and/or DATA), command information, address information, computational information, and other types of data and/or information necessary to the functionality of the memory controller 1200.

As described above in relation to FIG. 1, the migration manager 1250 may be used to control the execution of migration operation(s) by the memory device 1100; the management and update of a mapping table; and the monitoring and control of an update time. The operating principles of a competent migration manage in the context of the inventive concept will be described in some additional detail with reference to the embodiments illustrated in FIGS. 7, 8, 11, 12, 13, 14 and 15, for example.

The ECC unit 1260 may be used to encode write data received from the host 1300, and generate corresponding "encoded write data" during a write operation. The ECC unit 1260 may also be used to decode "encoded read data" retrieved from the memory device 1100 during a read operation in order to restore the data as originally received from the host 1300. Hence, various ECC encoding operations and/or various ECC decoding operations will hereafter be referred to as an "ECC operation".

The memory interface 1270 may be used to enable communication of data between the memory controller 1200 and the memory device 1100. For example, the memory interface 1270 may be a NAND type flash memory interface, or a vertical NAND (VNAND) type flash memory interface, etc.

Figure 3:
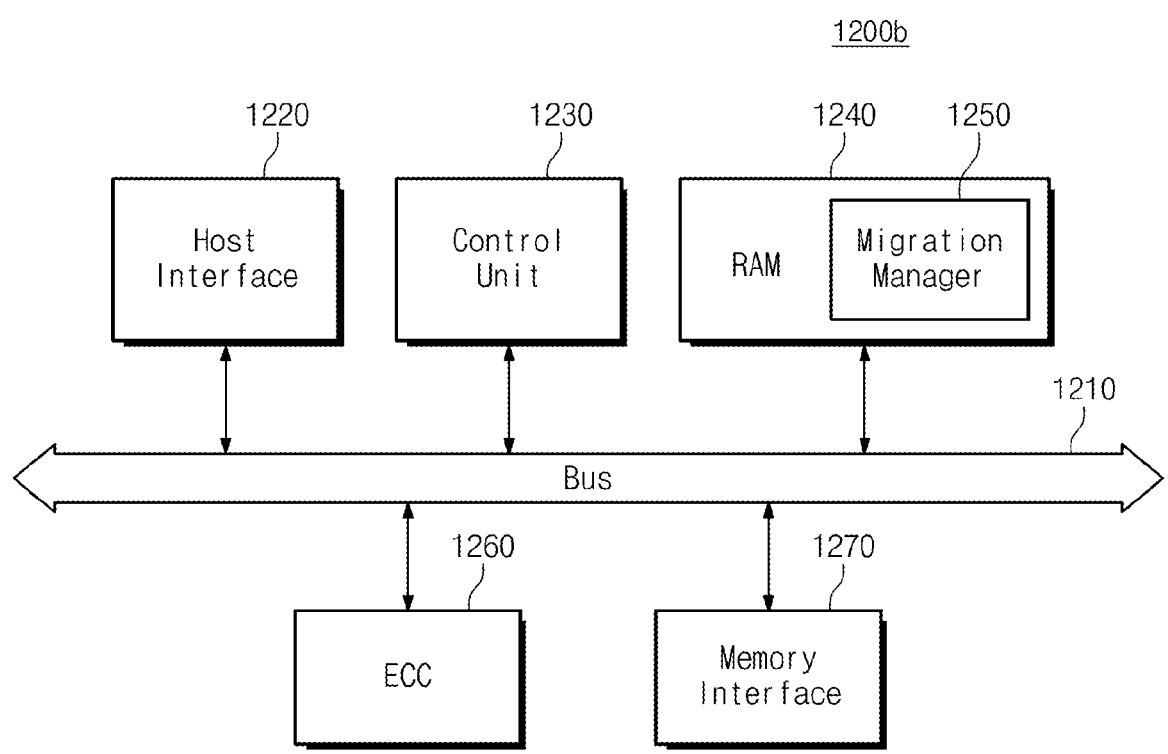
FIG. 3 is a block diagram further illustrating in another example the memory controller of FIG. 1.

FIG. 3 is a block diagram further illustrating in another example (1200*b*) the memory controller 1200 of FIG. 1. The elements described in relation to the memory controller 1200*a* of FIG. 2 are respectively the same as those shown in FIG. 3, except that certain software components used to implement the migration manager 1250 are shown as being specifically stored by the RAM 1240 during operation of the memory controller 1200*b*.

The memory device according to the embodiment of the inventive concept, may be applied not also a 2-dimensional structure flash memory but also a 3-dimensional structure flash memory 3D Flash memory.

Figure 4:
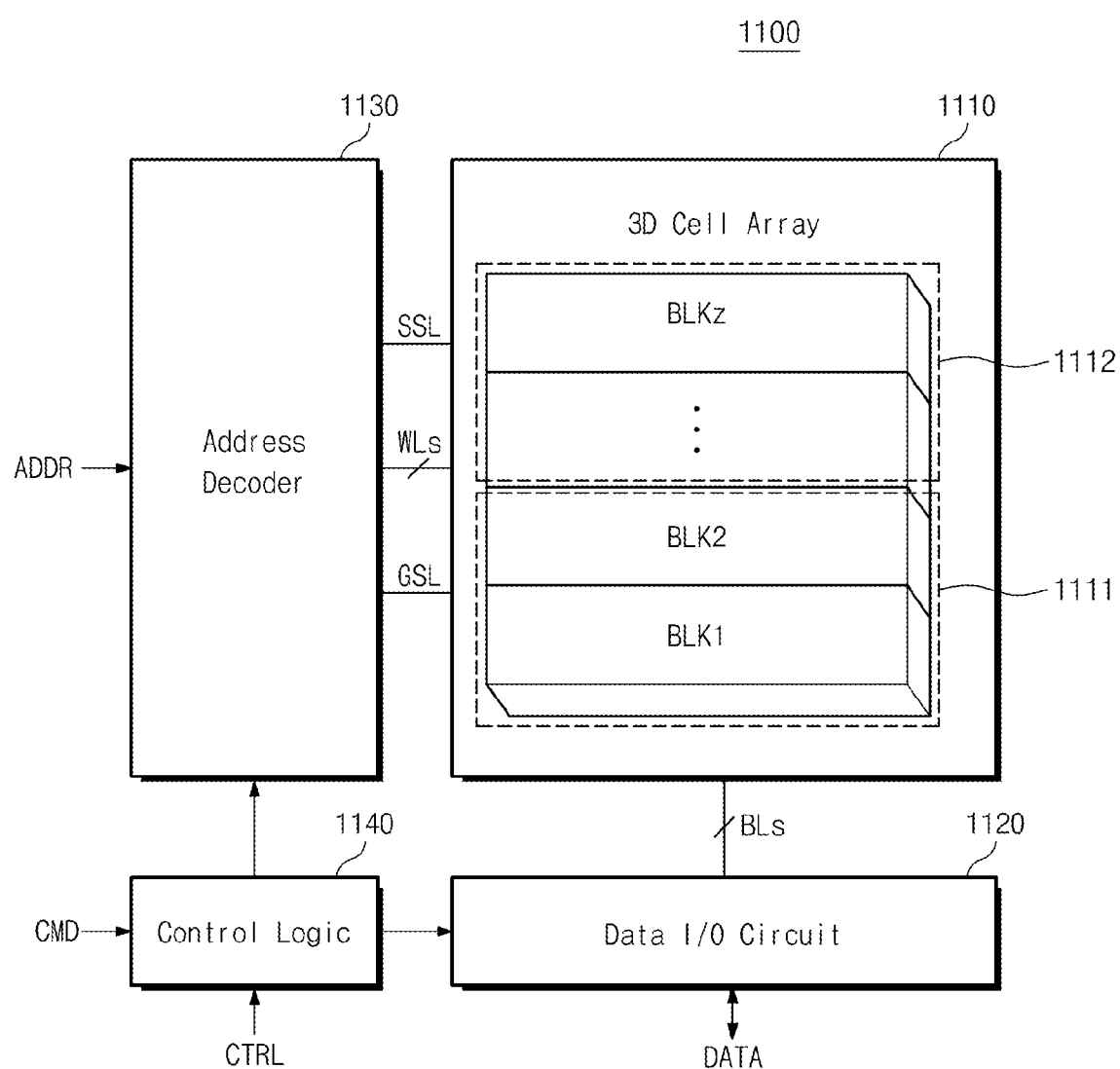
FIG. 4 is a block diagram further illustrating in one example the flash memory device of FIG. 1.

FIG. 4 is a block diagram further illustrating in one example the memory device 1100 being implemented, wholly or in part, to include a three-dimensional (3D) flash memory. Thus, referring to FIG. 4, the memory device 1110 comprises a 3D flash memory cell array 1110, a data input/output (I/O) circuit 1120, an address decoder 1130, and control logic 1140.

The 3D flash memory cell array 1110 is operationally partitioned (or designated for operation) into the buffer region 1111 and main region 1112. The 3D flash memory cell array 1110 is also logically and/or physically partitioned into a plurality of memory blocks (BLK1 to BLKz), wherein each memory block has a three-dimensional (or vertical) structure.

Each of the buffer region 1111 and main region 1112 may include a plurality of uniquely identifiable memory blocks, each memory block being an erasable unit for the memory device 1100.

The data I/O circuit 1120 may be used to functionally connect a plurality of bit lines extending across the 3D flash memory cell array 1110 to various external circuits. In this configuration, the data I/O circuit 1120 may be used to receive write data (or encoded write data), and may also be alternately used to receive read data retrieved from the 3D flash memory cell array 1110.

The address decoder 1130 may be used to functionally connect a plurality of word lines as well as at least one ground selection line GSL and string selection line SSL extending across the 3D flash memory cell array 1110 to various external circuits. In this configuration, the address decoder 1130 may be used to select one or more word lines in response to received address information ADDR.

The control logic 1140 may be used to control the overall execution of at least write (program), read, erase, and migration operations by the memory device 1100. That is, the control logic 1140 may be used to control operation of the address decoder 1130 such that a specified program voltage is applied to a selected word line during a program operation, and to further control the data I/O circuit 1120 to receive and hold write data to be programmed during the program operation.

Figure 5:
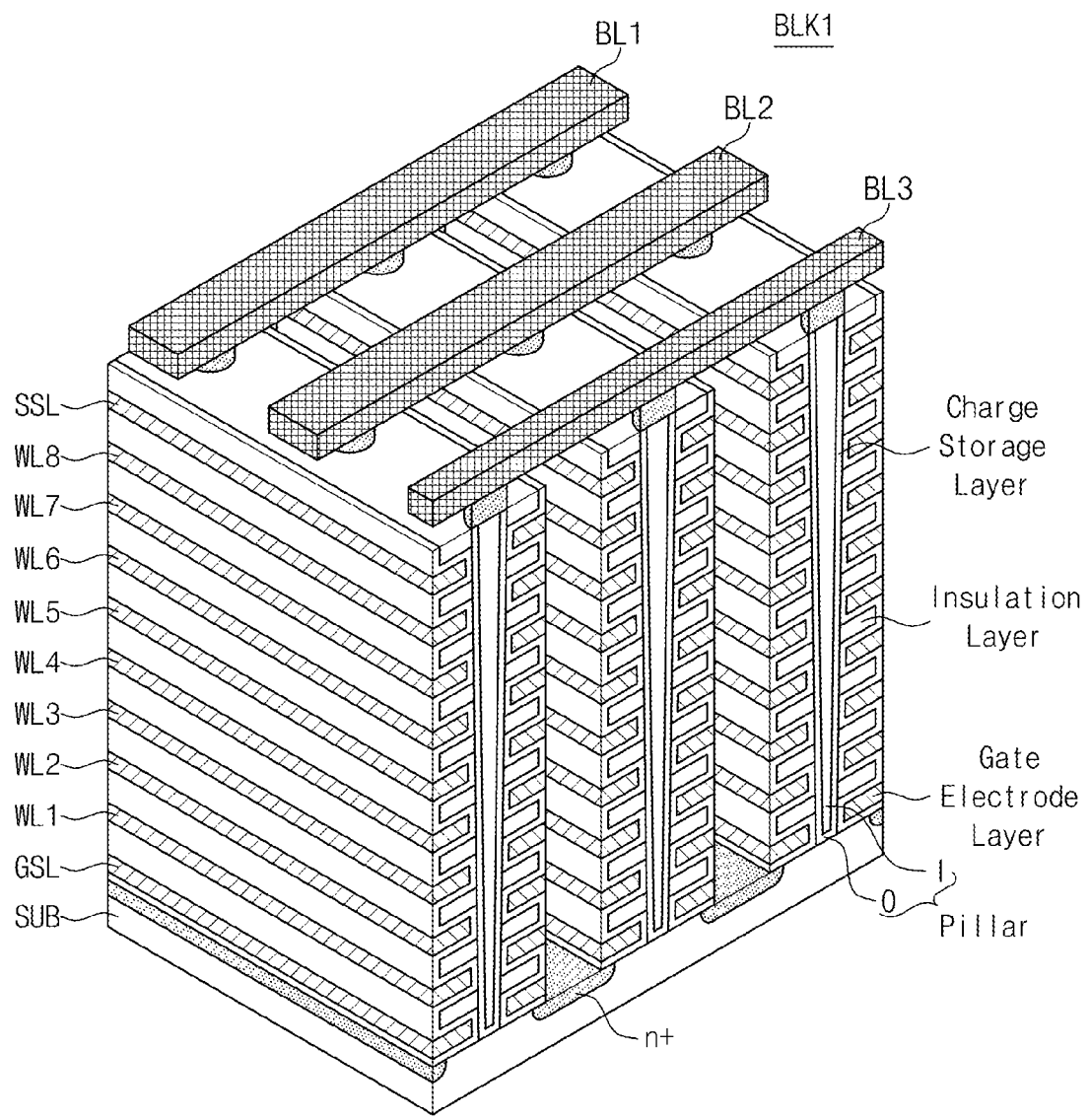
FIG. 5 is a perspective view illustrating one exemplary three-dimensional structure for the memory cell array illustrated in FIG. 4.

FIG. 5 is a perspective view illustrating in one example a portion of a 3D flash memory array corresponding to a first memory block (BLK1) shown in FIG. 4. Referring to FIG. 5, the first memory block, as an example of similarly configured memory blocks, is formed in a direction perpendicular to a principal substrate SUB. An n+ doping region is selectively formed in the substrate. A gate electrode layer and an insulation layer are then sequentially deposited on the substrate. A charge storage layer is formed between the gate electrode layer and the insulation layer.

If the gate electrode layer and the insulation layer are patterned in a vertical direction, a V-shaped pillar is formed. The pillar may thus be connected with the substrate via the gate electrode layer and the insulation layer. An outer portion 'O' of the pillar forms a semiconductor channel, while an inner portion 'I' forms an insulation material (e.g., silicon oxide) around the semiconductor channel.

The gate electrode layer of the memory block BLK1 is connected to a ground selection line GSL, a plurality of word lines WL1 to WL8, and a string selection line SSL. In this manner, the pillar BLK1 is connected with a plurality of bit lines BL1 to BL3. In FIG. 5, there is exemplarily illustrated a case in which one memory block BLK1 has two (2) ground/string selection lines and eight (8) word lines WL1 to WL8. However, embodiments of the inventive concept may have many different signal line definitions.

Figure 6:
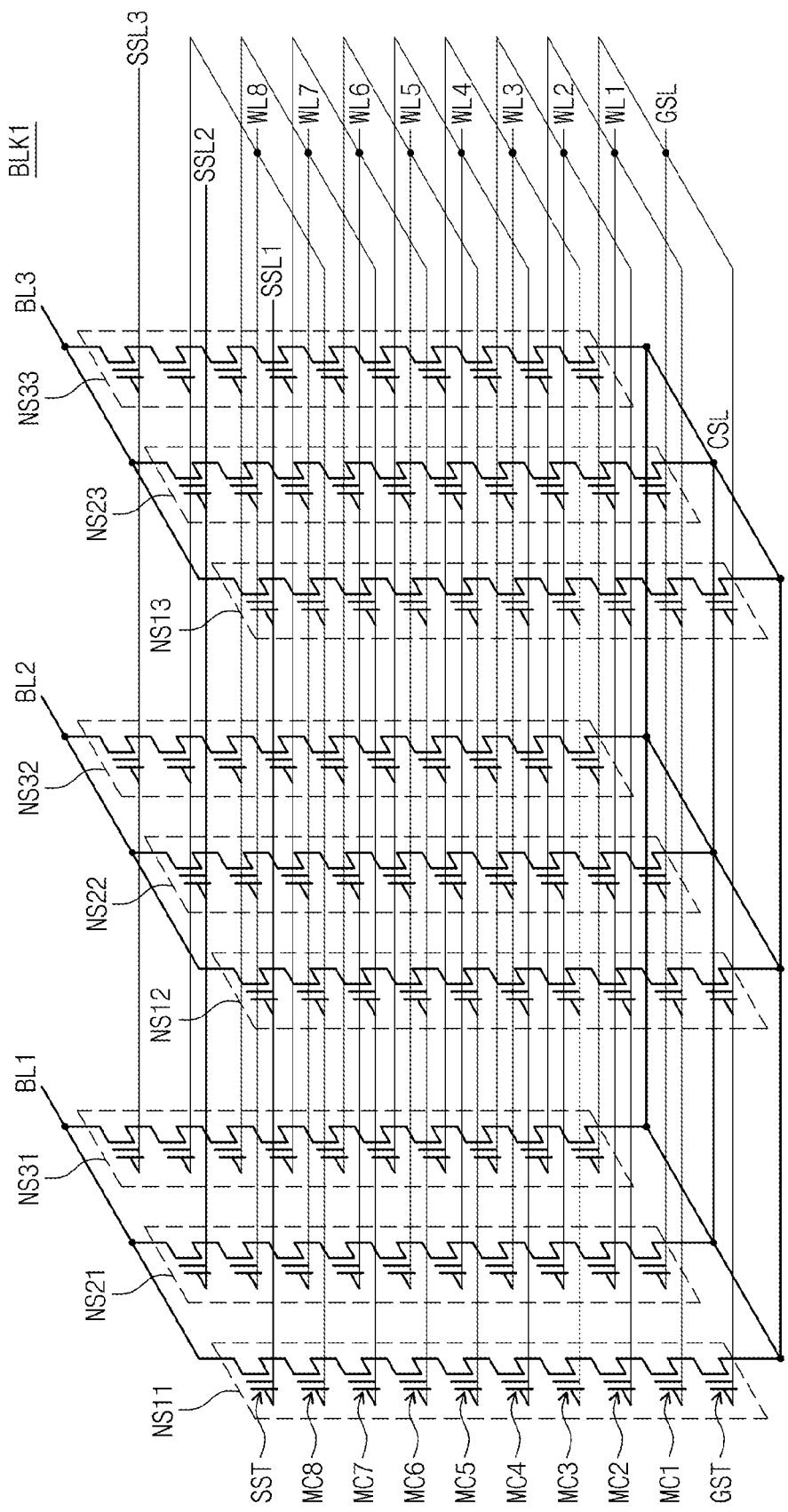
FIG. 6 is an equivalent circuit diagram for the partial memory cell array structure shown in FIG. 5.

FIG. 6 is an equivalent circuit diagram for the first memory block BLK1 shown in FIG. 5. Referring FIG. 6, NAND strings NS11 to NS33 are connected between bit lines BL1 to BL3 and a common source line CLS. Each NAND string (e.g., NS110) includes a string selection transistor SST, a plurality of memory cells MCI to MC8, and a ground selection transistor GST.

The string selection transistor SST may be connected with string selection lines SSL1 to SSL3. The memory cells MCI to MC8 may be connected with corresponding word lines WL1 to WL8, respectively. The ground selection transistor GST may be connected with ground selection lines GSL. A string selection transistor SST may be connected with a bit lines, and a ground selection transistor GST may be connected with a common source line CLS.

Word lines (e.g., WL1) having the same height may be commonly connected, and the ground selection lines GSL and the string selection lines SSL1 to SSL3 may be separated from one from another. During programming of the constituent memory cells of a designated "page" connected to a first word line WL1 and included in NAND strings NS11, NS12, and NS13, a first word line WL1, a first string selection line SSL1, and a first ground selection line will be selected by the various control circuits.

Figure 7:
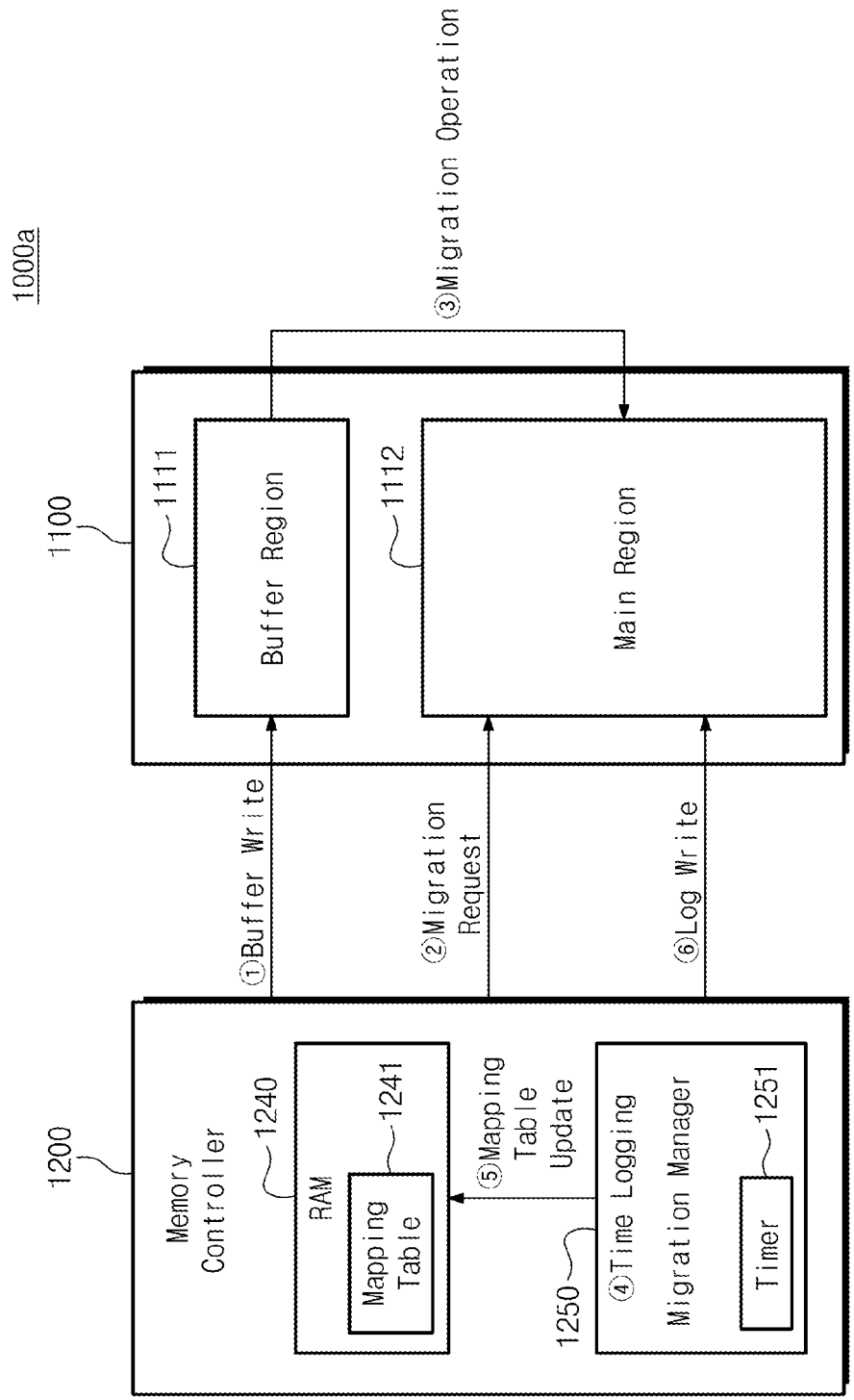
FIG. 7 is a block diagram illustrating in one example a method system and a method of operating the memory system that includes executing a migration operation according to certain embodiments of the inventive concept.

FIG. 7 is a block diagram of a memory system further illustrating in one example (1000*a*) the execution of a migration operation using the migration manager 1250 and RAM 1240 of the memory controller 1200 of FIG. 1 in relation to data being moved from the buffer region 1111 to the main region 1112 of the memory device 1100.

Here, it is assumed that memory system 1000*a* is a flash memory system configure to uses a log block (or a buffer block) to effectively manage stored data. The stored data may be identified with (associated with) a designated file. As will be seen hereafter, the memory system 1000*a* may be efficiently operated with a reduced number of merge operations and/or block erase operations when storing certain file data in the buffer region 1111 before thereafter moving the file data to the main region 1112. Operation of the memory system 1100*a* (or in other words, a method of operating the memory system 1000*a*) in this regard may be referred to "execution of a migration operation" consistent with the inventive concept.

Referring to FIGS. 1 and 7, the memory controller 1200 is assumed to communicate a "buffer write command" together with corresponding write data to the memory device 1100 ①
in response to a write request received from the host 1300.
Upon receipt by the memory device 1100, the write data is
stored in the buffer region 1111. The buffer write command
may take the form of a command causing execution of a
buffer program operation or a data write operation, depending
on the nature of the buffer region 1111.

After successfully storing of the write data in the buffer
region 1111, the memory controller 1200 may communicate
"a migration request" corresponding to a defined migration
operation to the memory device 1100 ②. The memory controller 1200 may issue a migration request to initiate execution of a migration operation for many different reasons. for
example, write data (or other types of specifically defined
data) previously stored in the buffer region 1111 may be
moved to the main region 1112 during an idle period of the
memory system (i.e., a period of time during which no read/
write/erase, etc., operations must be performed by the
memory controller 1200). Upon receipt of the migration
request from the memory controller 1200, the memory device
1100 will execute the migration operation that moves designated data stored in the buffer region 1111 to the main region
1112 ③.

Upon completion of the migration operation, the migration
manager 1250 may record (or "log" or "mark") a "migration
operation completion time" by entering a corresponding time
to a memory location (or register) associated with the migration manager. This method step may be referred to as
"completion time logging" or marking the completion time of
the migration operation ④. The migration operation completion time may be generated using a conventionally implemented timer 1251 (or analogous timing routine) controlled
by the migration manager 1250. Alternately, the timer may
implemented using circuitry and/or software disposed in the
control unit 1230 shown in FIG. 2. Here, the migration operation completion time provided by the timer 1251 may be
relevant to the consideration or monitoring of the IVS phenomenon noted above.

That is, as is understood by those skilled in the art, the
noted IVS phenomenon may self-correct after a fashion following a particular period of time related to the constituent
nature of the memory cells and memory cell array of the
memory system. For example, as the consequence of executing a program operation, for example, the IVS phenomenon
may affect the threshold voltage of certain memory cells in a
memory cell array. However, 100 ns later the threshold voltage of these memory cells will stabilize. In other words, after
a certain period of time (hereafter, "the IVS time") following
a potentially destabilizing execution of an operation (e.g., a
program operation or an erase operation), any resulting electron/hole rearrangement(s) in the material layer(s) of affected
memory cell layers will have ended.

Of further note, a particular IVS time associated with a
particular memory cell (or group of memory cells) will
depend on a number of factors including; location of the
memory cells in a block, location of the memory cells along
a word line, location of the memory cells along a bit line, the
current "wear level" of the memory cells (i.e., how many
program/erase cycles the memory cells have experienced
over their lifetime), etc.

Of course, any significant change the threshold voltage of
a memory cell due to the IVS phenomenon may impair the
read margin(s) for the corresponding stored data, thereby
reducing read data reliability. Therefore, following execution
of a migration operation, the memory system should only
read (or read verify) the threshold voltage of memory cells
storing the migrated data (or memory cells proximate the
memory cells storing the migrated data) after the IVS time has
elapsed in order to ensure read data reliability for the memory
system.

Thus, returning to the illustrated example of FIG. 7, the
threshold voltages of memory cells in the main region 1112
storing the data moved from the buffer region 1111 will
stabilize in relation to the IVS phenomenon following elapse
of the IVS time as measured from the migration operation
completion time. Therefore, only after the IVS time has
elapsed following execution of the migration operation
should the memory controller 1200 read the memory cells of
the main region 1112 receiving the moved data from the
buffer region 1111 (and possibly also memory cells proximate or adjacent thereto). Otherwise, an unaccounted for read
errors may arise.

Accordingly, the IVS time period following completion of
a migration operation is an excellent time to do other things,
such as using the migration manager to update a mapping
table 1241 store in RAM 1240 ⑤. Hence, the migration
manager 1250 may store an updated log of the mapping table
1241 stored in the RAM 1240. This operation will be
described in some additional detail with reference to FIGS. 9
and 10. However, in general, the memory controller 1200 may
store a either a fully updated version of the mapping table
1241, or only an updated portion of the mapping table 1241 in
relation to a working mapping table capable of being accessed
by the memory controller 1200. At certain times during the
operation of the memory controller 1200, or as part of a
memory system 1000*a* shut-down procedure, the memory
controller may store (or log) a current version of the mapping
table 1241 in a designated location of the memory device
1100 ⑥.

FIG. 8 is a table illustrating one possible composition
(1241*a*) of the mapping table 1241 shown in FIG. 7. Referring
to FIG. 8, the mapping table 1241 may include certain logical
addresses LA, certain physical addresses PA, as well as log
information. For example, it is assumed that a first range of
logical addresses LA '1' corresponds to a first range of physical addresses PA '0' located in the buffer region 1111. Following execution of a migration operation, the stored data is
moved to a location in the main region 1112 identified by a
second range of physical addresses PA '2'. Hence, the physical addresses listed in the mapping table 1241*a* and being
associated with the moved data must be updated to reflect the
change from the first range of physical addresses PA '0'
associated with locations in the buffer region 1111 to the
second range of physical addresses PA '2' associated with
locations in the main region 1112.

Thus, as shown in FIG. 8, each logical address LA listed in
a mapping table will have a correct, unique corresponding
physical address PA at all times, regardless of migration
operations.

Assuming a log format and log-based operation for the
mapping table 1241*a*, related log information may include;
time log information, a number of executed migration operations, etc. Thus, in conjunction with a logical address LA '1',
the mapping table 1241*a* may list migration time log information (ML1*a*), a number of migration operations associated
with memory cell(s) or block(s) corresponding to LA'1'
(ML1*b*), etc. And this type of log listing may similarly be
performed for LA '2' through LA'N'.

In this manner amongst others that will be apparent to those
skilled in the art, the migration manager 1250 may update
information in a mapping table, where the mapping information include logical address information, physical address
information, and migration operation time log information.

Figure 9:
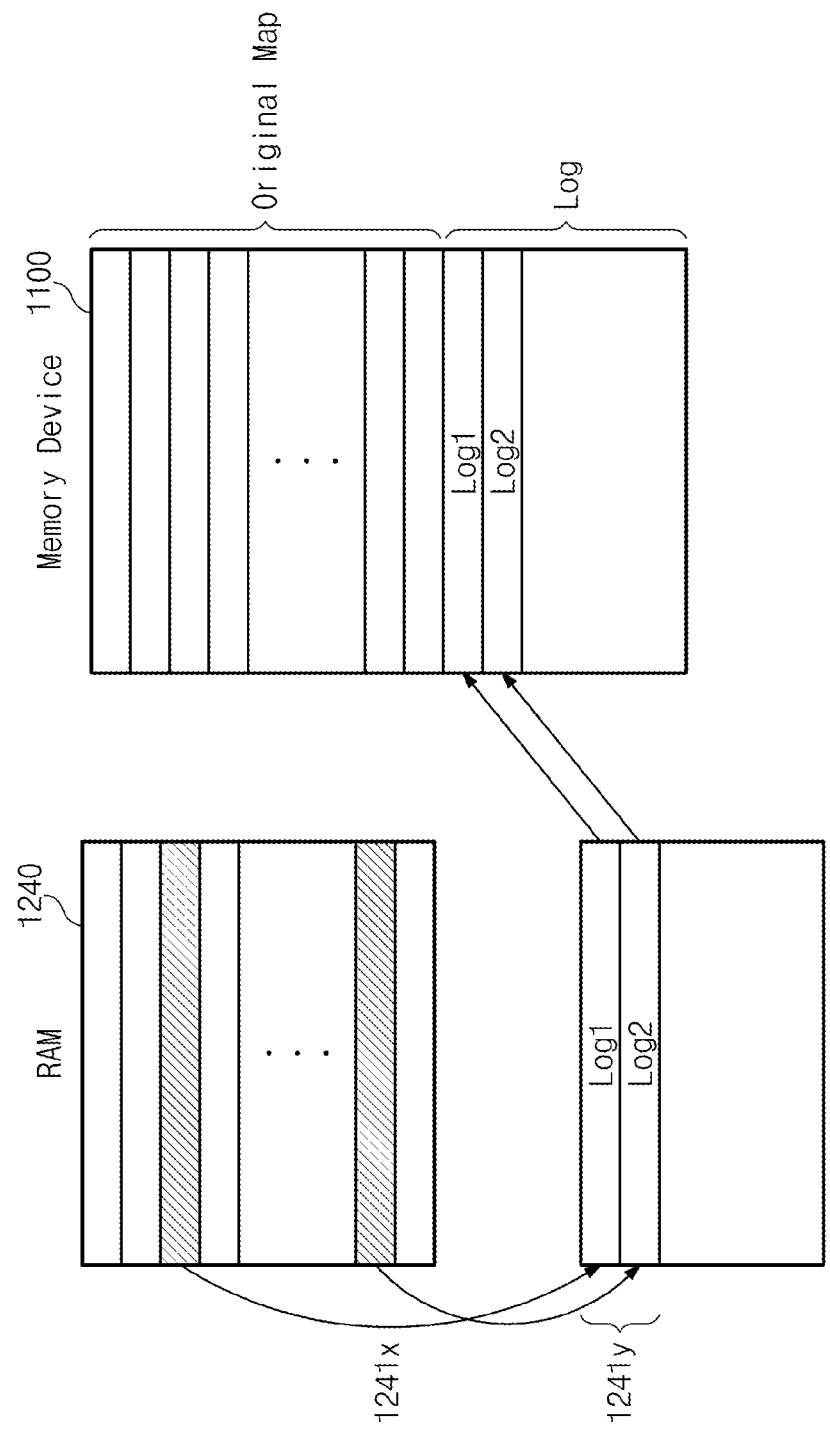
FIG. 9 is a conceptual diagram illustrating the transfer of mapping table data from a memory controller based RAM to the nonvolatile memory device of FIG. 7.

FIG. 9 is a conceptual diagram illustrating one approach whereby updated mapping table information may be moved from RAM 1240 to the memory device 1100 as part of the method described in relation to FIG. 7. Referring to FIGS. 2, 7 and 9, it is assumed that the mapping table 1241 is updated in RAM 1240, and then moved to the memory device 1100.

Under the control of the migration manager 1250 the mapping table 1241 is updated in RAM 1240 following execution of a migration operation. Since the RAM 1240 is implemented using volatile memory, it may be readily and immediately overwritten by the migration manager 1250. On the other hand, since the memory device 1100 is assumed to be implemented using flash memory, stored data must first be erased before being rewritten with new data. Accordingly, whenever a mapping table information is updated in nonvolatile memory device 1100, a block of data currently stored in the memory device 1100 must be erased. This necessity tends to wear out all of the memory cells in the block being erased. Accordingly, embodiments of the inventive concept more frequently update mapping table information in volatile memory (e.g., RAM 1240) to avoid stressing the nonvolatile memory cells of memory device 1100.

For example as shown in FIG. 9, an old version of mapping table 1241x previously stored in the RAM 1240 at the cross-hatched locations may be updated and moved by the migration manager 1250 to create a new version of the mapping table 1241y store at a different location in the RAM 1240. Only when necessary to ensure the data integrity of the mapping table information, must a memory system according to an embodiment of the inventive concept copy the contents of the mapping table 1241 from the RAM 1240 to the memory device 1100.

Figure 10:
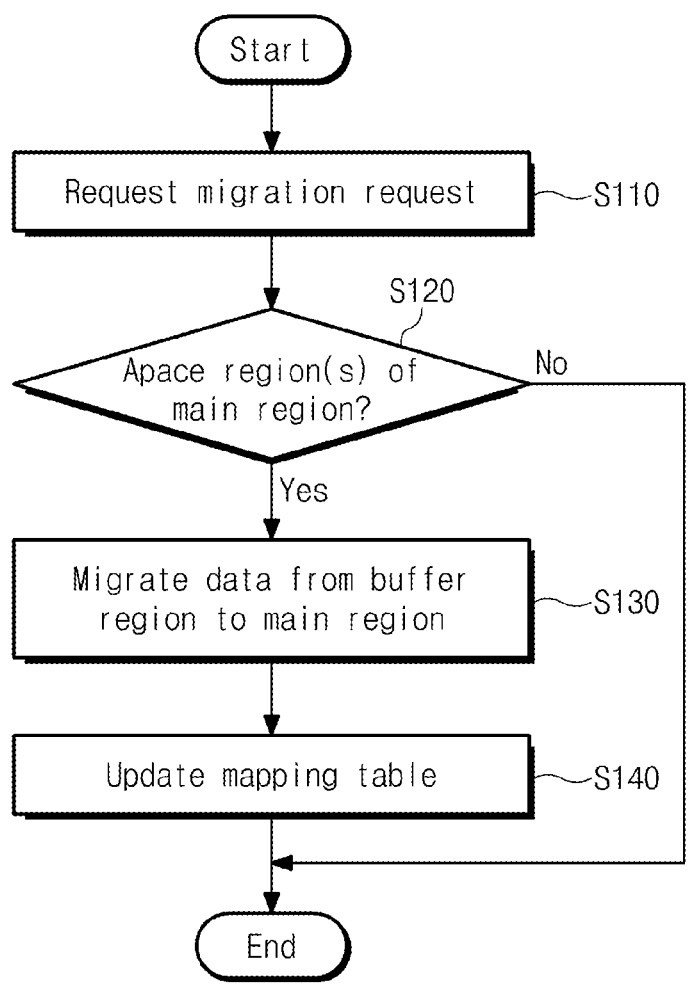
FIGS. 10, 11, 12 and 13 are respective flowcharts summarizing various methods of operating a memory system including a migration manager according to embodiments of the inventive concept.
Figure 11:
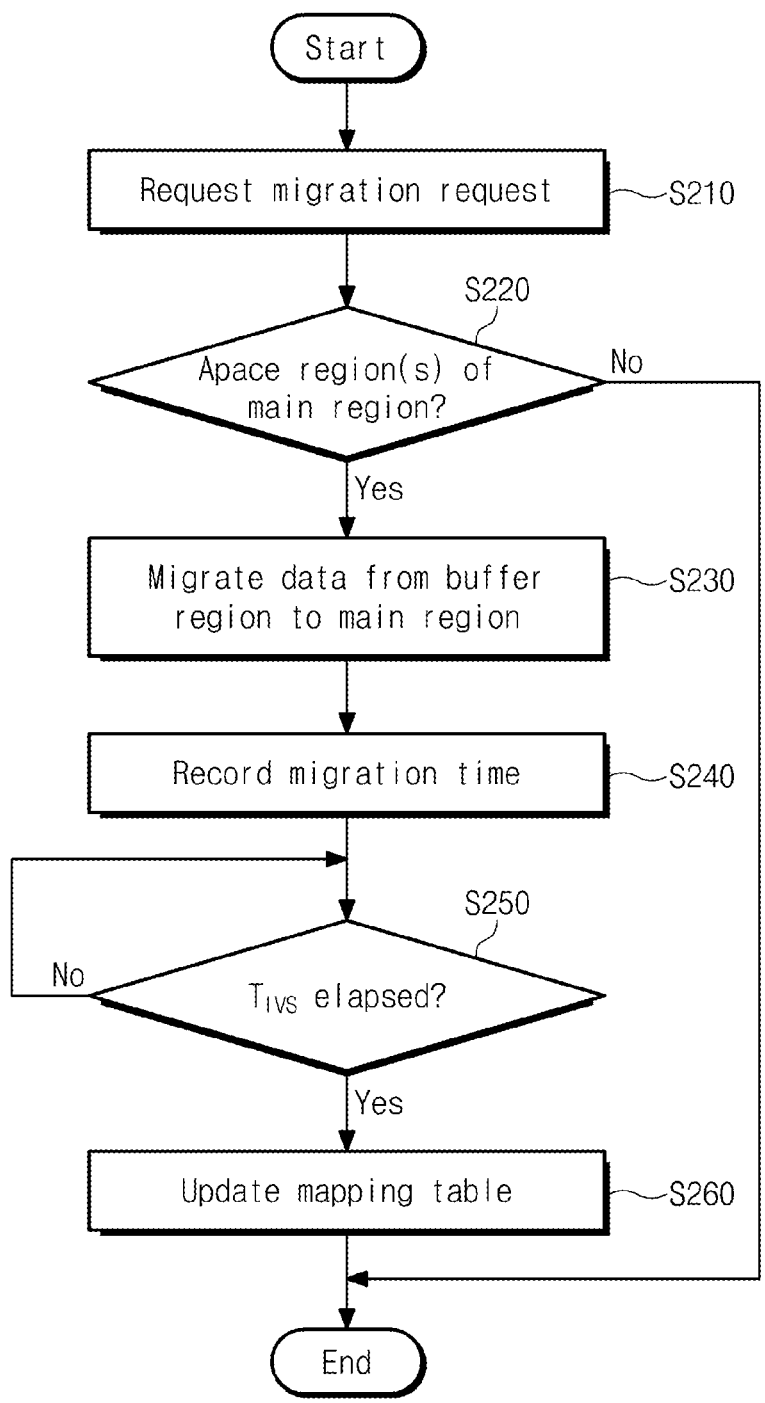

FIGS. 10 and 11 are respective flowcharts summarizing exemplary operations that may be performed by the migration manager 1250 and memory controller 1200 according to certain embodiments of the inventive concept.

In FIG. 10, the memory controller 1200 issues a migration request to the memory device 1100 (S110). Then, the memory controller 1200 determines whether or not sufficient spare regions(s) exist in the main region 1112 to facilitate the requested migration operation (S120). If sufficient spare region(s) of the main region exist (S120=Yes), identified data stored in the buffer region 1111 is moved to indicated spare region(s) of the main region 1112 (S130). Thus, assuming the main region 1112 is implemented using flash memory, the memory cells of the spare region(s) are first erased and then re-written to store the date previously stored in the buffer region. If there are insufficient spare region(s) in the main region 1112, the migration operation is terminated without moving the data from the buffer region 1111.

After executing the migration operation (S130), the migration manager 1250 of the memory controller 1200 will update the mapping table (S140). Here, the migration manager 1250 may immediately update the mapping table following execution of the migration operation. Thus, if, for example, the host 1300 issues a read request directed to the data moved from the buffer region 1111 to the main region 1112 during the migration operation following the migration operation, the memory controller 1200 may delay execution of the read operation until the mapping table has been successfully updated.

In FIG. 11, steps S210, S220, S230 and S260 are respectively analogous to steps S110, S120, S1230 and S140 described in relation to FIG. 10. However, following execution of the migration operation (S230), the migration manager 1250 generates (and logs) a migration operation completion time (S240). This point in time may then be used to "time-out" an IVS time for at least the memory cells subject to the migration operation (S250). That is, the migration manager 1250 will then determine when the IVS time ($T_{IVS}$) has lapsed following completion of the migration operation, before updating the mapping table (S260).

As a result, if the IVS time has not lapsed following execution of the migration operation and the host 1300 nonetheless communicate a read request directed to the data moved from the buffer region 1111 to the main region 1112, the migration manager 1250 will cause the read operation to retrieve the read-requested data from the buffer region 1111 since the mapping table has not yet been updated. Accordingly, the host may receive the read data of the buffer region quickly and without read errors.

Figure 12:
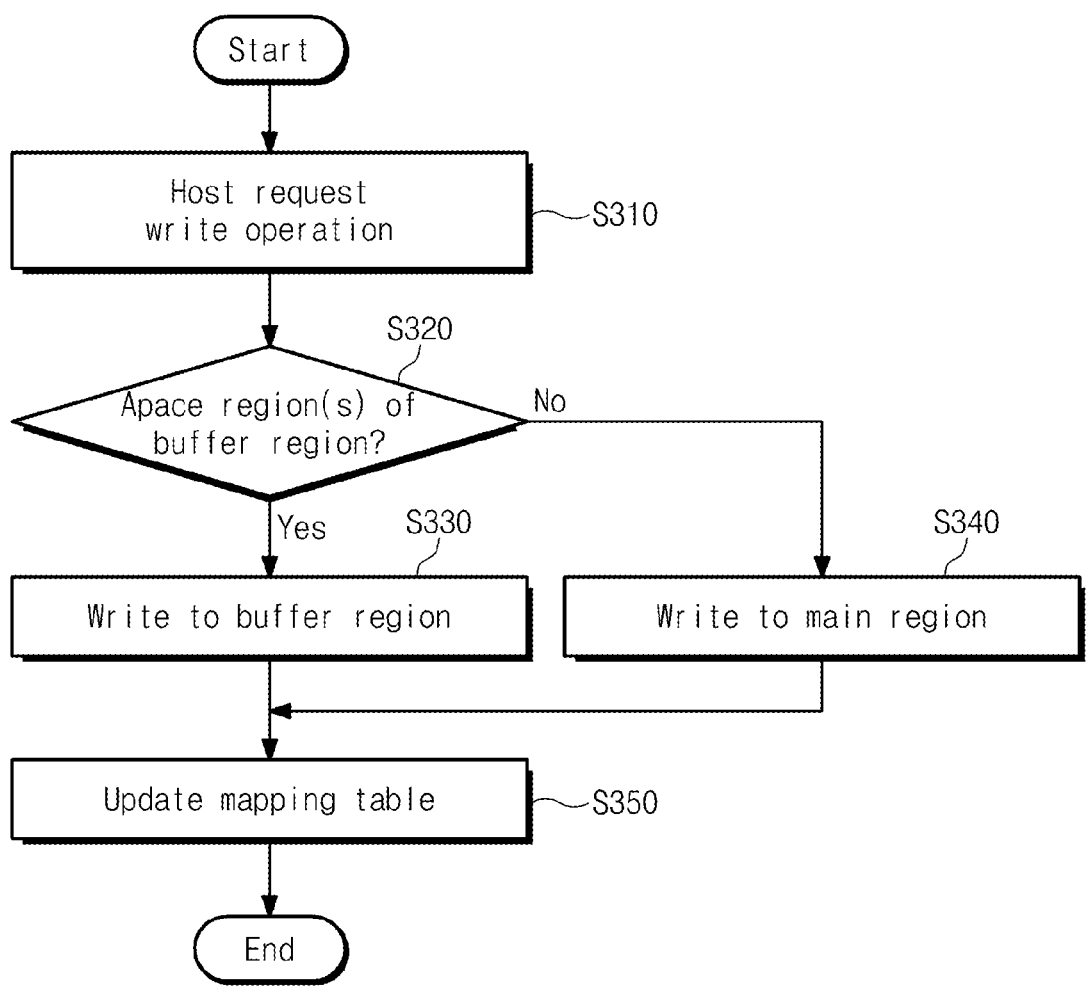
Figure 13:
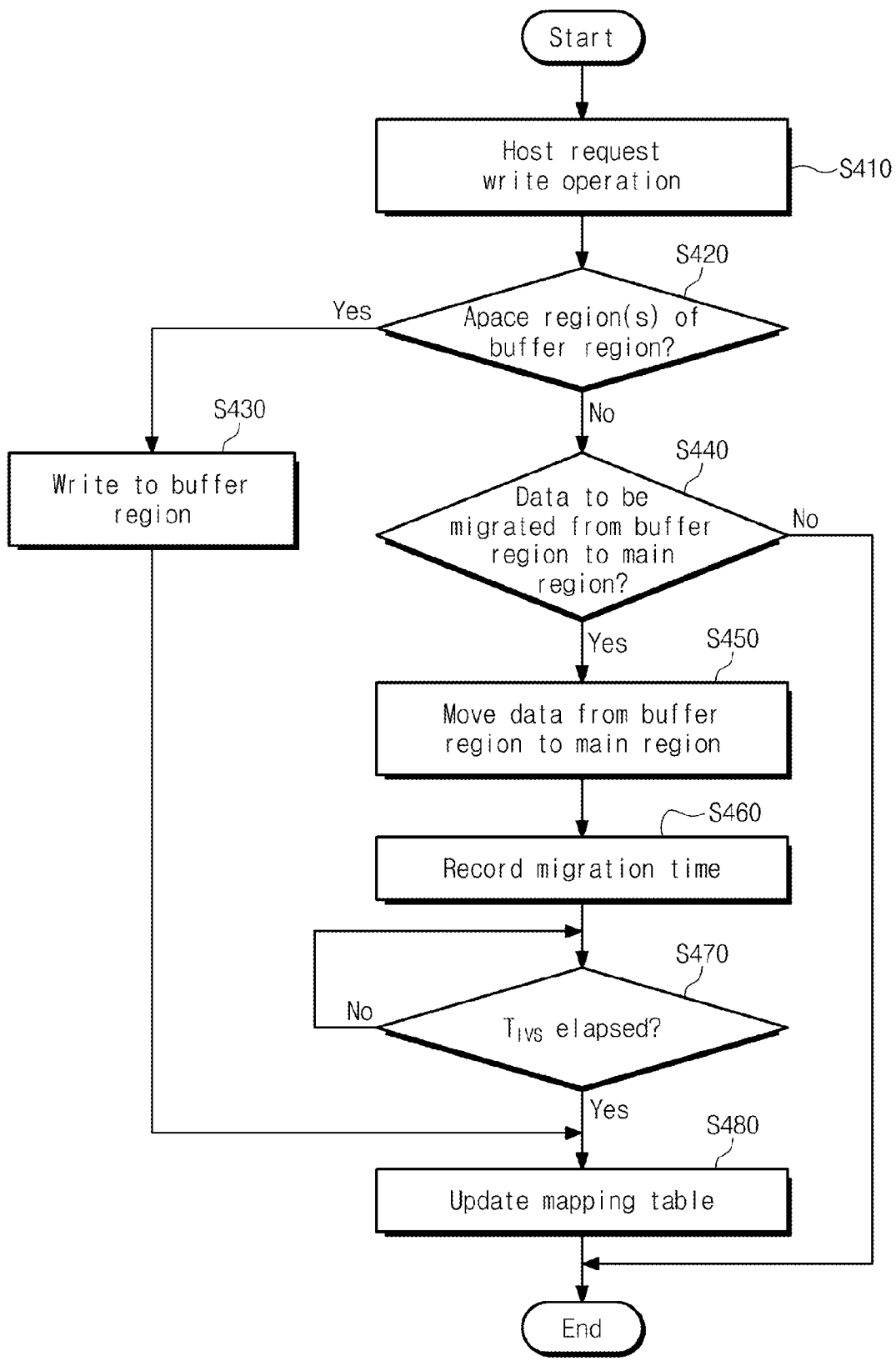

FIGS. 12 and 13 are respective flowcharts summarizing exemplary operations that may be performed by the migration manager 1250 and memory controller 1200 according to certain embodiments of the inventive concept.

In FIG. 12, the memory controller 1200 receives a write (or program) request from the host 1300 (S310). Then, the memory controller 1200 determines whether or not sufficient spare region(s) exist in the buffer region 1111 to accommodate the write request (S320). If there are sufficient spare region(s) in the buffer region 1111 (S320=Yes), the memory controller 1200 writes the write data associated with the write request to the buffer region (S330), else (S320=No), the memory controller 1200 writes the write data to the main region 1112 (S340). Following either write step (S330 or S340), the migration manager 1250 of the memory controller 1200 may be used to update the mapping table (S350).

In FIG. 13, steps S410, S420 and S430 are respectively analogous to steps S310, S320 and S330. However, following a determination that there are insufficient spare regions in the buffer region (S420=No), the memory controller 1200 will next determine whether or not certain "identified data" currently stored in the buffer region 1111 may be safely moved to the main region 1112 in order to create additional spare regions in the buffer region 1111 (S440).

If so, (S440=Yes), a migration operation is execution in relation to the identified data (S450). Then, a corresponding record migration time is recorded (S450), and following elapse of the IVS time (S470), the mapping table is updated by the migration manager (S480).

Figure 14:
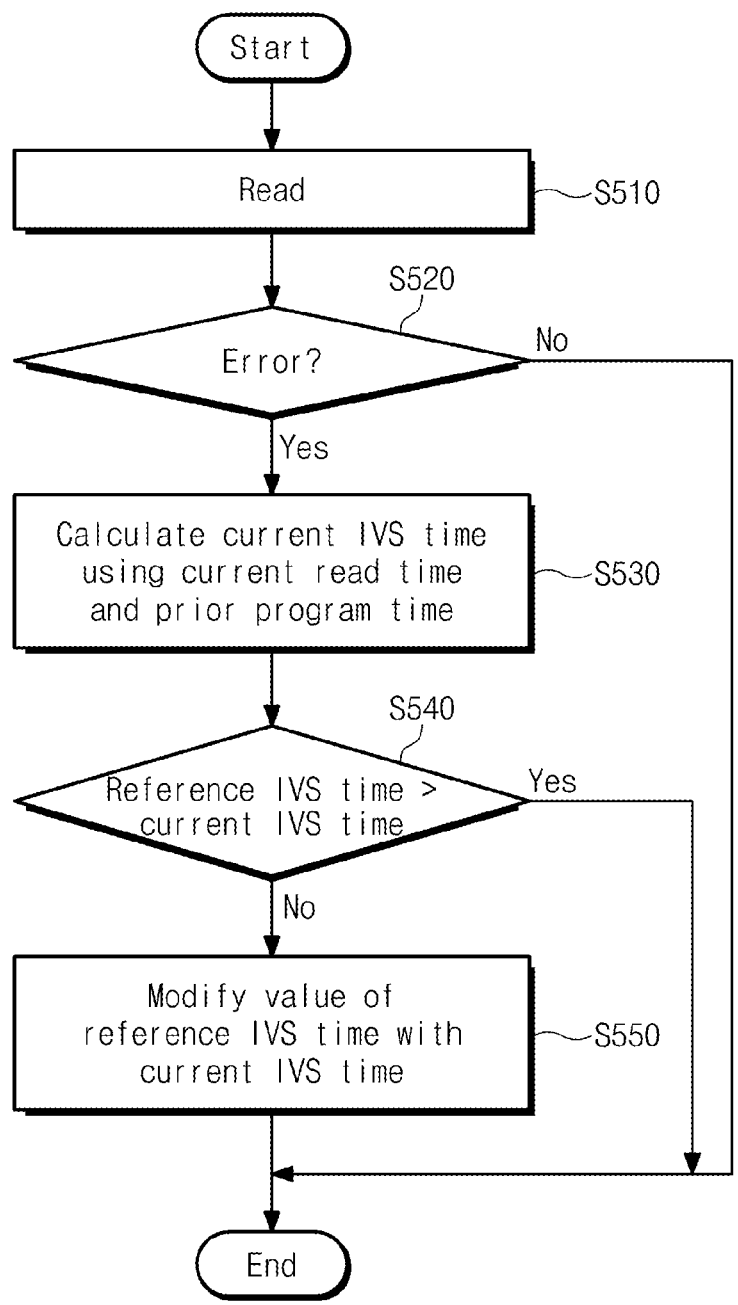
FIG. 14 is a flowchart summarizing a method of calculating and changing a reference IVS time that may be used in conjunction with a memory system including a migration manager according to embodiments of the inventive concept.

FIG. 14 is a flowchart summarizing a method of monitoring, calculating and changing as necessary one or more IVS time(s) associated with one or more memory cells that may be incorporated in an embodiment of the inventive concept. Of note, the IVS time ($T_{IVS}$) may be fixed as a reference value, or it may be real-time changeable in accordance with certain memory system operating and/or environmental factor(s).

Thus, in FIG. 14, the memory device 1100 may read a memory cell region in relation to a received address (S510). Then, the memory controller 1200 may determine whether one or more read errors occurs in relation to the read data (S520). If a read error occurs (S520=Yes), the memory controller 1200 may calculate and change an existing IVS time, else (S520=No) the method ends.

Thus, upon determining that a read error has occurred, the memory controller will calculate a current IVS time using (e.g.,) a current read operation execution time and previous program operation execution time (S530). That is, the current IVS time may be calculated as a difference between a current read operation execution time and the prior program operation execution time. For example, assume a prior program operation execution time of 100 ns and current read operation execution time of 150 ns. A current IVS time may be calculated to be 50 ns. Here, a current IVA time of 50 ns means that it takes 50 ns more to perform a read operation after a program operation.

Base on this calculation, the migration manager 1250 may compare the value of the current IVS time with predetermined reference IVS time (S540). If the value of reference IVS time is greater than the value of the current IVS time (S540=Yes), then the memory controller 1200 will determine that the cause of the read error(s) is not IVS phenomenon related and end the method. Otherwise, if the value of reference IVS time is not greater than the value of the current IVS time (S540=No), the memory controller 1200 will determine that the read errors may be the IVS phenomenon related, and modify the reference IVS time in view of the current IVS time (S550). That is, the migration manager 1250 may modify the value of reference IVS time to be equal to the current IVS time. This is done since the reference IVS time is not sufficient to ensure that the IVS phenomenon is not a factor in changing threshold voltages following execution of a migration operation. Thus, the migration manager 1250 will redefine the value of reference IVS time, and as a result, the waiting period criterion for updating a corresponding mapping table will be applied as the changed reference IVS time.

Figure 15:
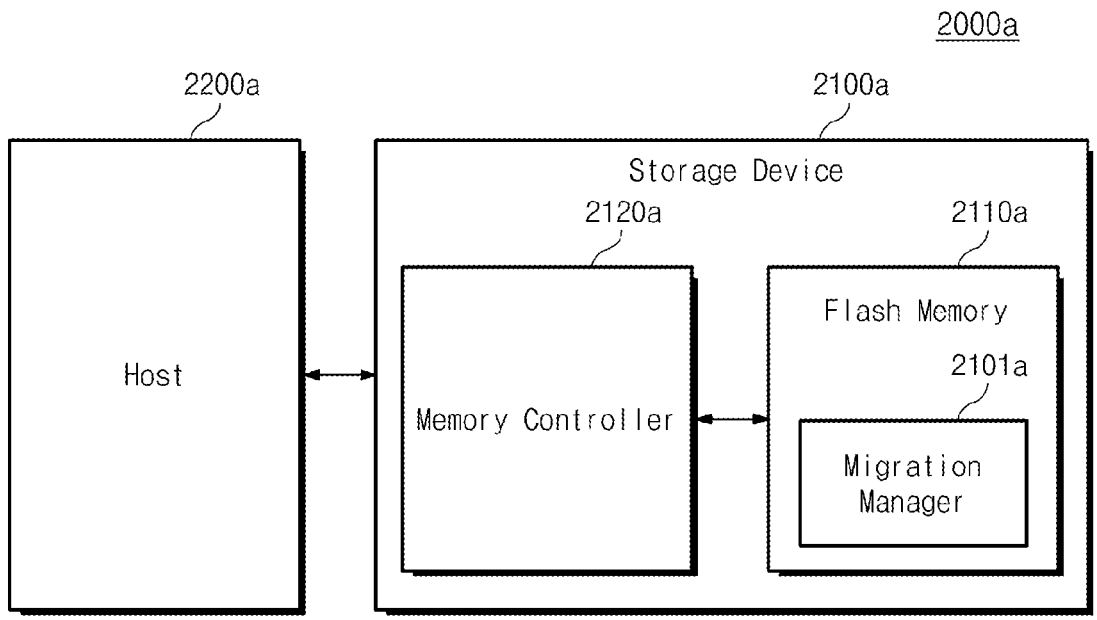
FIGS. 15 and 16 are block diagrams illustrating applications that may incorporate a memory system according to an embodiment of the inventive concept.
Figure 16:
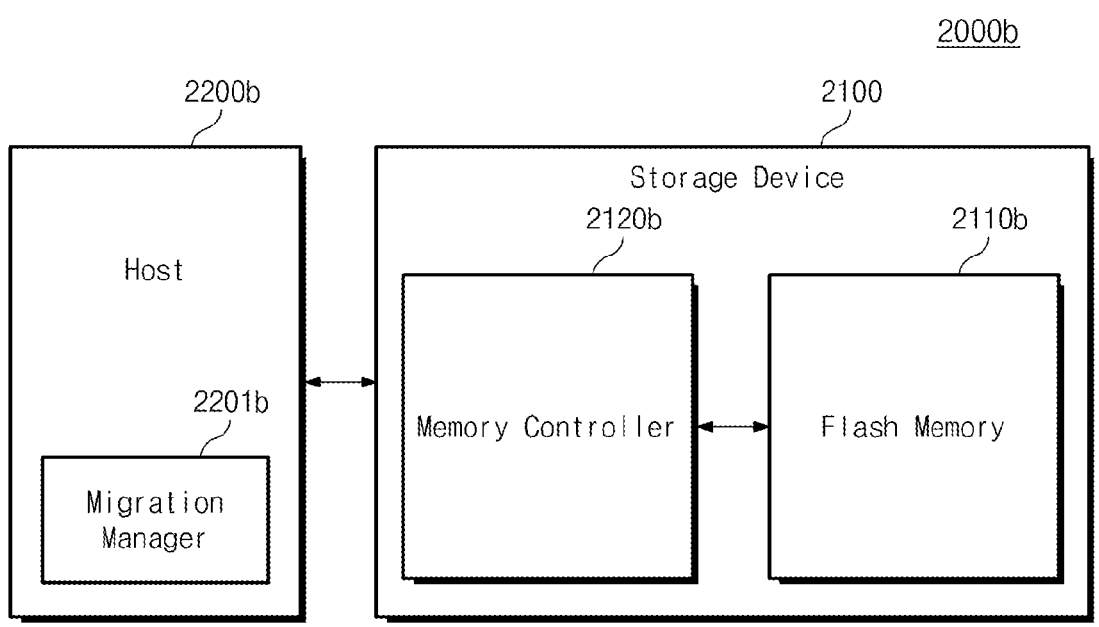

FIGS. 15 and 16 are block diagrams respectively illustrating applications that may incorporate a memory system according to an embodiment of the inventive concept. Referring to FIGS. 15 and 16, a memory system 2000a, 2000b comprises a storage device 2100a, 2100b, and a host 2200a, 2200b. The storage device 2100a, 2100b may include a flash memory 2110a, 2110b and a memory controller 2120a, 2120b.

The storage device 2100a, 2100b may include a storage medium such as a memory card (e.g., SD, MMC, etc.) or an attachable handheld storage device (e.g., an USB memory). The storage device 2100a, 2100b may be connected with the host 2200a, 2200b. The storage device 2100a, 2100b may transmit and receive data to and from the host via a host interface. The storage device 2100a, 2100b may be supplied with a power from the host 2200a, 2200b.

Referring to FIG. 15, a migration manager 2101a may be included in a flash memory 2110a, and referring to FIG. 16, a migration manager 2101b may be included in a host 2200b. Memory systems 2000a, 2000b according to embodiments of the inventive concept may reduce read errors occurring due to the IVS phenomenon associated with memory cells of a nonvolatile memory using the migration manager. Further, the inventive concept may perform a migration operation efficiently even where available memory space in (e.g.,) an SLC region is currently insufficient. This may be accomplished by assigning part of an existing MLC region of the nonvolatile memory device as a temporary cache region.

Figure 17:
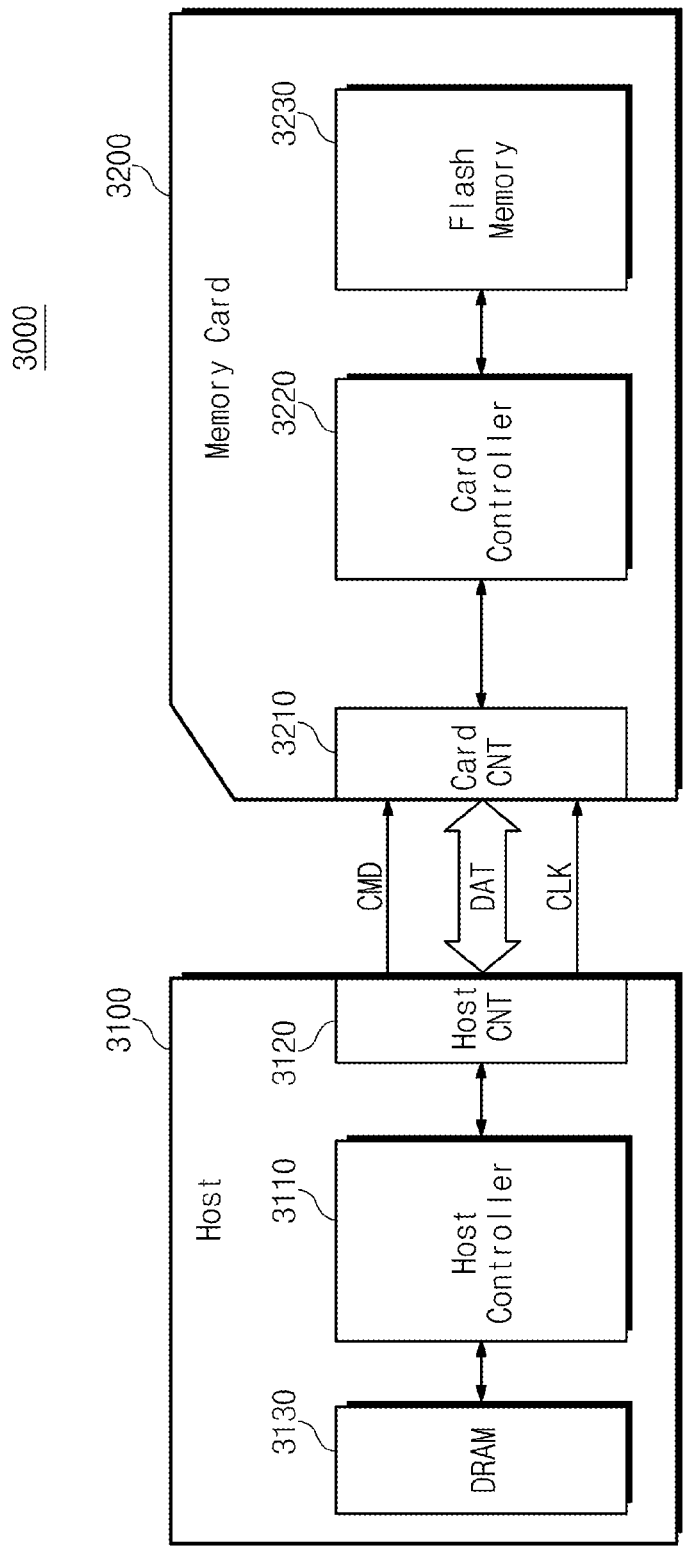
FIG. 17 is a block diagram illustrating a memory card system that may incorporate a memory system according to an embodiment of the inventive concept.

FIG. 17 is a block diagram illustrating a memory card system 3000 that may incorporate a memory system according to an embodiment of the inventive concept. The memory card system 3000 includes a host 3100 and a memory card 3200. The host 3100 includes a host controller 3110, a host connection unit 3120, and a DRAM 3130.

The host 3100 may write data in the memory card 3200 and read data from the memory card 3200. The host controller 3110 may send a command (e.g., a write command), a clock signal CLK generated by a clock generator (not shown), and corresponding write data to the memory card 3200 via the host connection unit 3120. The DRAM 3130 may be used as a main memory by the host 3100.

The memory card 3200 may include a card connection unit 3210, a card controller 3220, and a flash memory 3230. The card controller 3220 may store data in the flash memory 3230 in response to a command input via the card connection unit 3210. The data may be stored synchronously with respect to the clock signal generated by a clock generator (not shown) in the card controller 3220. The flash memory 3230 may store data transferred from the host 3100. For example, in a case where the host 3100 is a digital camera, the flash memory 3230 may store image data.

A memory card system 3000 illustrated in FIG. 17 may include a migration manager configured in the host controller 3110, card controller 3220, or the flash memory 3230. As described above, embodiments of the inventive concept including the use of a migration manager will reduce the possibility of read errors arising due to the effects of the IVS phenomenon in certain nonvolatile memory types. Further, the inventive concept may efficiently perform migration operation(s) even there is initially insufficient memory space available in a SLC region of the constituent nonvolatile memory device. In such situations, a portion of a MLC region may be assigned within the flash memory 3230 as a temporary cache region.

Figure 18:
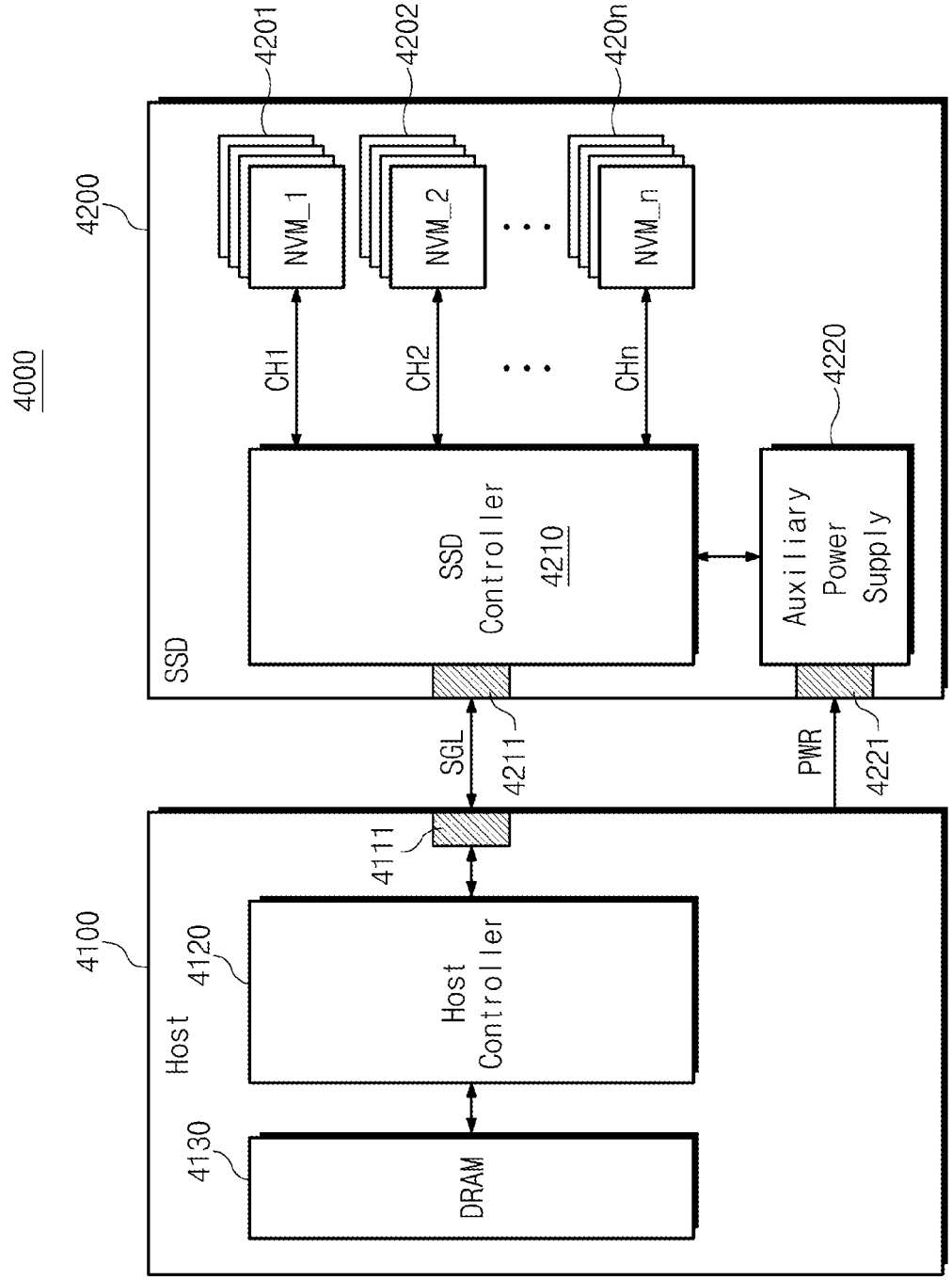
FIG. 18 is a block diagram illustrating a solid state drive (SSD) that may incorporate a memory system according to an embodiment of the inventive concept.

FIG. 18 is a block diagram illustrating a solid state drive (SSD) including a memory system according to an embodiment of the inventive concept. Referring to FIG. 18, a SSD 4000 generally includes a host 4100, and an SSD 4200. The host 4100 includes a host interface 4111, a host controller 4120, and a DRAM 4130.

The host 4100 may be used to write data to the SSD 4200, and to read data from the SSD 4200. The host controller 4120 may be used to transfer signals (SGL) such as command(s), address(es), and/or control signal(s) to the SSD 4200 via the host interface 4111. The DRAM 4130 may be used as main memory of the host 4100.

The SSD 4200 may be configured to exchange SGL signals with the host 4100 via the host interface 4211, and may also be configured to receive power via a power connector 4221. The SSD 4200 includes a plurality of nonvolatile memories 4201 to 420n, an SSD controller 4210, and an auxiliary power supply 4220. Herein, the nonvolatile memories 4201 to 420n may be implemented using not only one or more flash memory devices, but also PRAM, MRAM, ReRAM, etc.

The plurality of nonvolatile memories 4201 to 420n may be used as the storage medium of SSD 4200. The plurality of nonvolatile memories 4201 to 420n may be connected with the SSD controller 4210 via a plurality of channels, CH1 to CHn. One channel may be connected with one or more nonvolatile memories. Nonvolatile memories connected with one channel may be connected with the same data bus.

The SSD controller 4210 may exchange signals SGL with the host 4100 via the host interface 4211. Herein, the signals SGL may include a command, an address, data, and the like. The SSD controller 4210 may be configured to write or read out data to or from a corresponding nonvolatile memory according to a command of the host 4100. The SSD controller 4210 will be more fully described with reference to FIG. 19.

The auxiliary power supply 4220 may be connected with the host 4100 via the power connector 4221. The auxiliary power supply 4220 may be charged by a power PWR from the host 4100. The auxiliary power supply 4220 may be placed within the SSD 4200 or outside the SSD 4200. For example, the auxiliary power supply 4220 may be disposed on a main board to supply an auxiliary power to the SSD 4200.

Figure 19:
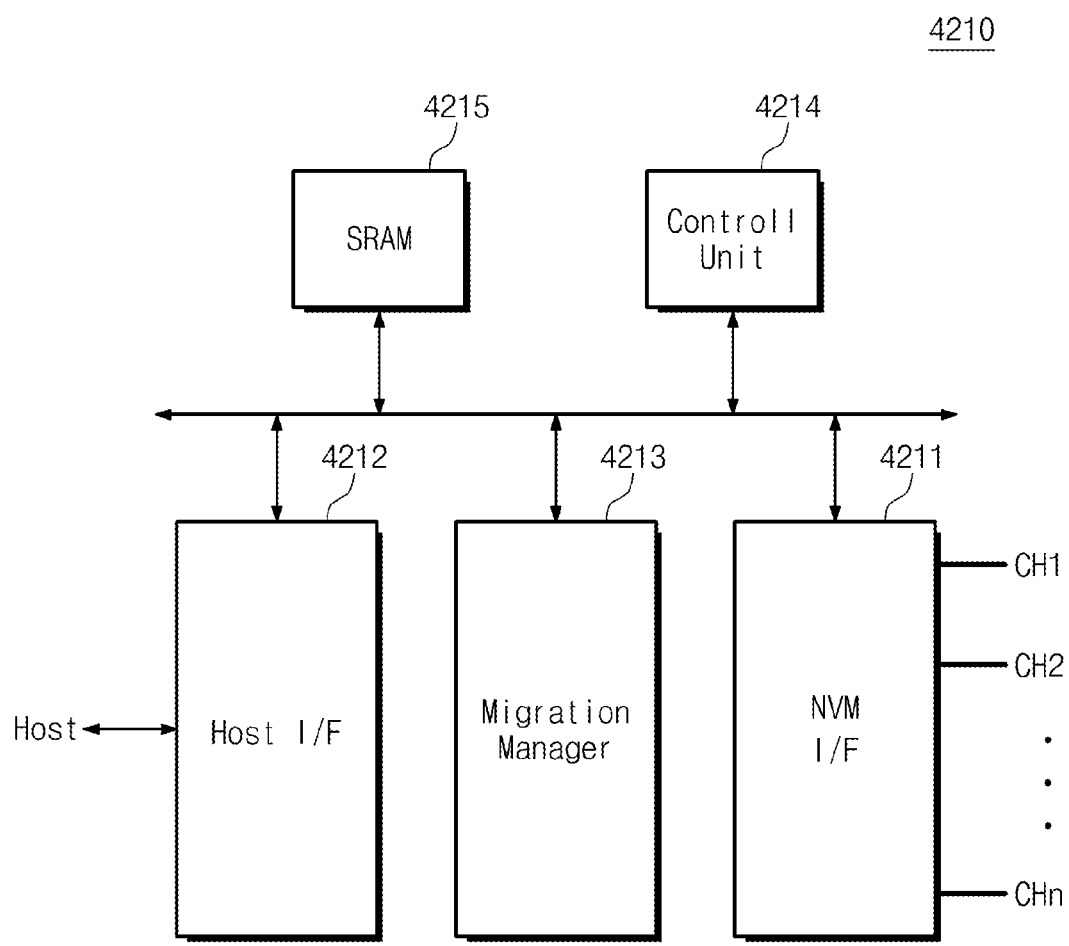
FIG. 19 is a block diagram further illustrating the SSD controller of FIG. 18.

FIG. 19 is a block diagram further illustrating the SSD controller 4210 of FIG. 18. Referring to FIG. 19, the SSD controller 4210 comprises an NVM interface 4211, a host interface 4212, a migration manager 4213, control unit 4214, and an SRAM 4215.

The NVM interface 4211 may scatter data transferred from a main memory of a host 4100 to channels CH1 to CH*n*, respectively. The NVM interface 4211 may transfer data read from nonvolatile memories 4201 to 420*n* to the host 4100 via the host interface 4212.

The host interface 4212 may provide an interface with an SSD 4200 according to the protocol of the host 4100. The host interface 4212 may communicate with the host 4100 using USB, SCSI, PCI, PCI-E, ATA, parallel ATA, serial ATA, SAS, etc. The host interface 4212 may perform a disk emulation function which enables the host 4100 to recognize the SSD 4200 as a hard disk drive (HDD).

The migration manager 4213 may be used to manage the execution of a migration operation in relation to the nonvolatile memories 4201 to 420*n*, as described above. The control unit 4214 may be used to analyze and process signals SGL input from the host 4100. The control unit 4214 may be used to control the host 4100 via the host interface 4212 or the nonvolatile memories 4201 to 420*n* via the NVM interface 4211. The control unit 4214 may control the nonvolatile memories 4201 to 420*n* using firmware that drives at least in part the operation of SSD 4200.

The SRAM 4215 may be used to drive software which efficiently manages the nonvolatile memories 4201 to 420*n*. The SRAM 4215 may store metadata input from a main memory of the host 4100 or cache data. At a sudden power-off operation, metadata or cache data stored in the SRAM 4215 may be stored in the nonvolatile memories 4201 to 420*n* using an auxiliary power supply 4220.

Returning to FIG. 18, the SSD system 4000 incorporating techniques consistent with the inventive concept may markedly reduce the possibility of read errors arising from the effects of the IVS phenomenon on the memory cells of the nonvolatile memories 4201 to 420*n*. Further, embodiments of the inventive concept may perform migration operations efficiently although spare regions in a buffer (SLC) region are insufficient to accommodate the write data provided in conjunction with a current write (program) operation. This may be accomplished by assigning a portion of a main (MLC) region of the nonvolatile memories 4201 to 420*n* to one or more respective buffer region(s).

Figure 20:
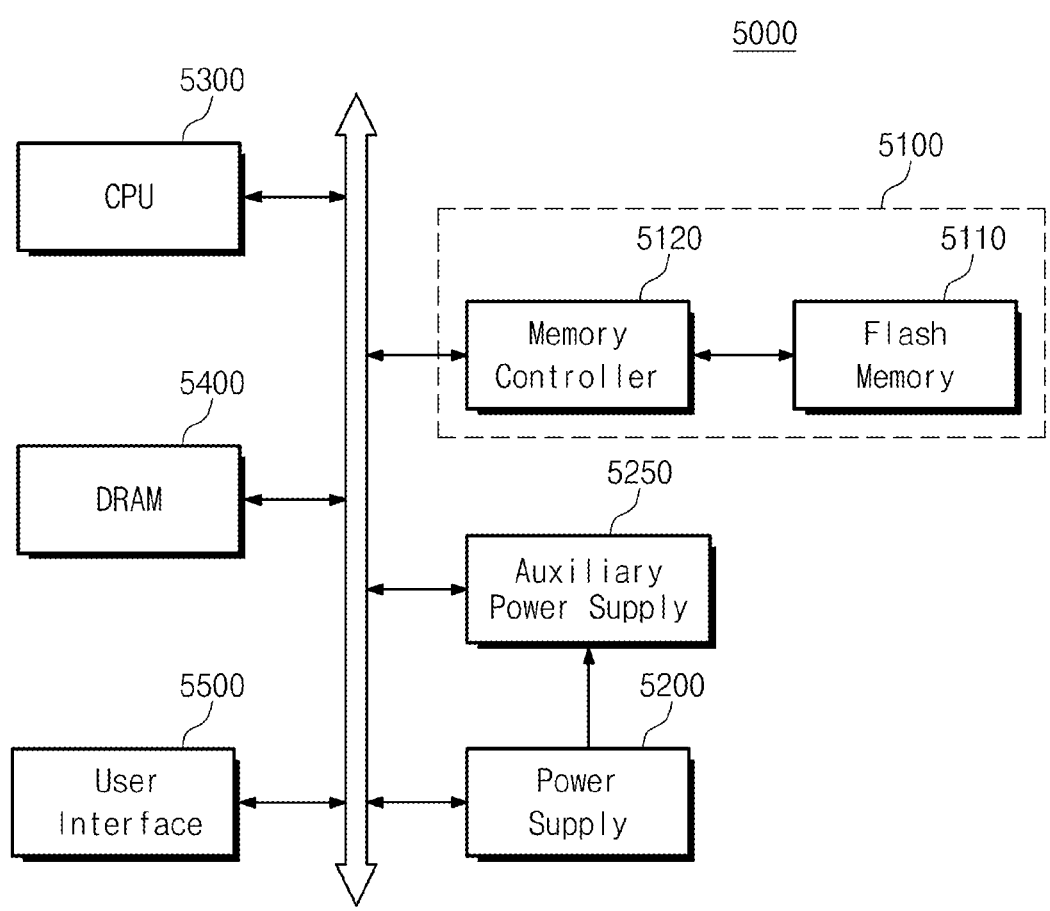
FIG. 20 is a block diagram illustrating an electronic device that may incorporate a memory system according to an embodiment of the inventive concept.

FIG. 20 is a block diagram illustrating an electronic device that may incorporate a memory system according to an embodiment of the inventive concept. Herein, an electronic device 5000 may be a personal computer (PC), handheld electronic device such as a notebook computer, a cellular phone, a personal digital assistant (PDA), a digital camera, etc.

Referring to FIG. 20, the electronic device 5000 generally comprises a memory system 5100, a power supply device 5200, an auxiliary power supply 5250, a central processing unit (CPU) 5300, a DRAM 5400, and a user interface 5500. The memory system 5100 may be embedded within the electronic device 5000.

As described above, by incorporating a memory system according to an embodiment of the inventive concept, the electronic device 5000 may reduce the possibility of read errors arising due to the effects of the IVS phenomenon on the memory cells of the of flash memory 5110. Further, embodiments of the inventive concept may efficiently perform migration operation(s) even when spare region(s) of a buffer (SLC) region are insufficient to accommodate incoming write data. This may be accomplished by assigning a portion for a main (MLC) region of the flash memory 5110 to temporarily serve as part of the buffer region(s).

The above-disclosed subject matter is to be considered illustrative in nature, and the scope of the following claims extends over many modifications and enhancements that will become apparent to those of ordinary skill in the art upon consideration of the foregoing. Thus, to the maximum extent allowed by law, the scope of the claims shall be determined by the broadest permissible interpretation, and shall not be restricted or limited to only the foregoing illustrated embodiments.

What is claimed is:

1. A nonvolatile memory system comprising:

a nonvolatile memory device including first and second regions each including at least one three dimensional memory block, the at least one three dimensional memory block including a plurality of strings connected between a bit line and a common source line, each of the plurality of strings including a plurality of memory cells connected in a series, each of the plurality of memory cells being connected to word lines stacked in a direction perpendicular to a substrate; and a memory controller configured to manage data in the first region and the second region based on a mapping table, to execute a migration operation in which first data in the first region is migrated from the first region into the second region, and to update the mapping table according to the migration operation after a certain period of time has elapsed from when the migration operation is completed, wherein the memory controller comprises a volatile memory configured to store the mapping table, the mapping table comprising logical addresses, physical addresses corresponding to each of the logical address, and log information corresponding to each of the logical address, wherein the log information comprises migration time log information and a physical address of the second region in which the first data is stored after the migration operation, wherein upon updating the mapping table, the memory controller is configured to store the updated mapping table based on the log information in a different location of the volatile memory and copy the updated mapping table from the different location of the volatile memory to the nonvolatile memory device, wherein the memory controller is further configured to execute a read operation in response to a read request received from a host after the migration operation is completed, wherein the read request is executed with reference to the mapping table before the mapping table is updated when the read request is received before the certain period of time has elapsed, and wherein the read request is executed with reference to the mapping table after the mapping table is updated when the read request is received after the certain period of time has elapsed.

2. The nonvolatile memory system of claim 1, wherein when the read request is received before the certain period of time elapsed from when the migration operation is completed, the memory controller is configured to read the first data in the first region based on the mapping table, and when the read request is received after the certain period of time has elapsed from when the migration is completed, the memory controller is configured to read the first data in the second region based on the mapping table.

3. The nonvolatile memory system of claim 1, wherein the memory controller is further configured to receive a write request and second data from a host, and write the received second data in the first region.

4. The nonvolatile memory system of claim 3, wherein the memory controller is configured to migrate the second data in the first region into the second region during an idle period.

5. The nonvolatile memory system of claim 1, wherein the memory controller is further configured to receive a write request and second data from a host, determine whether or not sufficient spare region exist in the first region to accommodate the write request, and write the second data in the first region or the second region based on a result of the determination.

6. The nonvolatile memory system of claim 5, wherein if there are sufficient spare region in the first region, the memory controller is configured to write the second data in the first region, and if there are insufficient spare region in the first region, the memory controller is configured to write the second data in the second region.

7. The nonvolatile memory system of claim 1, wherein the first region comprises a plurality of memory cells, each storing N-bit (N is a positive integer), and the second region comprises a plurality of memory cells, each storing M-bit (M is a positive integer greater than the N).

8. The nonvolatile memory system of claim 1, wherein the memory controller is configured to update the mapping table by changing a first physical address identifying a first memory location in the first region at which the first data was stored to a second physical address identifying a second memory location in the second region to which the first data was migrated.

9. The nonvolatile memory system of claim 1, wherein the certain period of time is dependent on at least one of locations and a number of program and erase cycles of memory cells in the second region.

10. The nonvolatile memory system of claim 1, wherein the certain period of time is an Initial Verify Shift (IVS) time for stabilizing threshold voltages of memory cells in the second region after the memory cells in the second region are programmed.

11. An operation method of a nonvolatile memory system including a memory controller and at least one nonvolatile memory device including at least one three dimensional memory block, the at least one three dimensional memory block including a plurality of strings connected between a bit line and a common source line, each of the plurality of strings including a plurality of memory cells connected in a series, and each of the plurality of memory cells being connected to word lines stacked in a direction perpendicular to a substrate, the operation method comprising:
migrating first data in a first region of at least one the nonvolatile memory device from the first region into a second region of the at least one nonvolatile memory device;
updating a mapping table after a certain period of time has elapsed from when the migrating is completed; and
receiving a read request from a host device after the migrating is completed,
wherein the memory controller is configured to manage data in the first region and the second region of the at least one nonvolatile memory device based on the mapping table,
wherein the memory controller comprises a volatile memory configured to store the mapping table, the mapping table comprising logical addresses, physical addresses corresponding to each of the logical address, and log information corresponding to each of the logical address,
wherein the log information comprises migration time log information and a physical address of the second region in which the first data is stored after the migration operation,
wherein upon updating the mapping table, the memory controller is configured to store the updated mapping table based on the log information in a different location of the volatile memory and copy the updated mapping table from the different location of the volatile memory to the nonvolatile memory device,
wherein a read operation corresponding to the read request is performed based on the mapping table before the updating when the read request is received before the certain period of time has elapsed from when the migrating is completed, and
wherein a read operation corresponding to the read request is executed based on the mapping table after the updating when the read request is received after the certain period of time has elapsed from when the migrating is completed.

12. The operation method of claim 11, wherein when the read request is received after the certain period of time has elapsed from when the migrating is completed, the read operation is performed on the first region to read the first data, and
when the read request is received before the certain period of time is elapsed from when the migrating is completed, the read operation is performed on the second region to read the first data.

13. The operation method of claim 11 further comprising:
receiving a write request and second data from a host;
determining whether or not a sufficient spare region in the first region exists to accommodate the write request; and
writing the second data in the first region or the second region based on a result of the determination.

14. The operation method of claim 13, wherein the writing the second data in the first region based on a result of the determination comprises:
when there is the sufficient spare region in the first region, writing the second data in the first region; and
when there is not the sufficient spare region in the second region, migrating data from the first region into the second region.

15. The operation method of claim 14, wherein if there is not the sufficient spare region in the first region, migrating data from the first region into the second region comprises:
determining whether there is data to be migrated among data in the first region;
migrating the determined data from the first region into the second region; and
updating the mapping table after the certain period of time has elapsed from when the migrating the determined data is completed.

16. The operation method of claim 11 further comprising:
receiving another read request and an address from a host;
reading data corresponding to the received address;
determining whether an error has occurred in the reading data;
calculating an Initial Verify Shift (IVS) time using a read execution time and a previous program execution time based on a result of the determination;
comparing the calculated IVS time with the certain period of time; and
modifying the certain period of time as the calculated IVS time based on a result of comparison.

17. The storage device comprising:
at least one nonvolatile memory device including a first region and a second region each comprising at least one three dimensional memory block, the at least one three dimensional memory block including a plurality of strings connected between a bit line and a common source line, each of the plurality of strings including a plurality of memory cells connected in a series, each of the plurality of memory cells being connected to word lines stacked in a direction perpendicular to a substrate; and
a memory controller including a volatile memory configured to store a mapping table used to manage data in the first and second regions,
wherein the memory controller is configured to manage data in the first and second regions using the mapping table in the volatile memory, migrate data in the first region from the first region into the second region, and update the mapping table after a certain period time has elapsed from when the migration is completed to reflect that the data is migrated to the second region,
wherein the mapping table comprising logical addresses, physical addresses corresponding to each of the logical address, and log information corresponding to each of the logical address,
wherein the log information comprises migration time log information and a physical address of the second region in which the first data is stored after the migration operation,
wherein upon updating the mapping table, the memory controller is configured to store the updated mapping table based on the log information in a different location of the volatile memory and copy the updated mapping table from the different location of the volatile memory to the nonvolatile memory device,
wherein the memory controller is further configured to perform a read operation associated with the data in response to a read request received from a host after the data is migrated to the second region,
wherein the read operation is performed with reference to the mapping table before the mapping table is updated when the read request is received before the certain period of time has elapsed from when the migration is completed, and
wherein the read operation is performed with reference to the mapping table after the mapping table is updated when the read request is received after the certain period of time from when the migration is completed.

18. The storage device of claim 17, wherein when the read request is received after the certain period of time has elapsed from when the migration is completed, the memory controller is configured to perform the read operation on the second region, and
when the read request is received before the certain period of time has elapsed from when the migration is completed, the memory controller is configured to perform the read operation on the second region.

* * * * *